United States Patent
Soe et al.

(10) Patent No.: US 12,451,346 B2
(45) Date of Patent: Oct. 21, 2025

(54) MODULATED ATOMIC LAYER DEPOSITION

(71) Applicant: Lam Research Corporation, Fremont, CA (US)

(72) Inventors: Chan Myae Myae Soe, Santa Clara, CA (US); Chloe Baldasseroni, Portland, OR (US); Shiva Sharan Bhandari, Sherwood, OR (US); Pulkit Agarwal, Beaverton, OR (US); Adrien LaVoie, Newberg, OR (US); Bart J. Van Schravendijk, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/737,855

(22) Filed: Jun. 7, 2024

(65) Prior Publication Data
US 2024/0332007 A1 Oct. 3, 2024

Related U.S. Application Data

(62) Division of application No. 17/594,816, filed as application No. PCT/US2019/040648 on Jul. 3, 2019, now Pat. No. 12,040,181.

(Continued)

(51) Int. Cl.
*H01L 21/02* (2006.01)
*C23C 16/40* (2006.01)
(Continued)

(52) U.S. Cl.
CPC ........ *H01L 21/0228* (2013.01); *C23C 16/401* (2013.01); *C23C 16/45536* (2013.01);
(Continued)

(58) Field of Classification Search
None
See application file for complete search history.

(56) References Cited

U.S. PATENT DOCUMENTS

| | | | |
|---|---|---|---|
| 4,500,563 | A | 2/1985 | Ellenberger et al. |
| 5,094,984 | A | 3/1992 | Liu et al. |

(Continued)

FOREIGN PATENT DOCUMENTS

| | | | |
|---|---|---|---|
| CN | 1552097 A | 12/2004 | |
| CN | 1732288 A | 2/2006 | |

(Continued)

OTHER PUBLICATIONS

Cecchi et al., (2007) "Ultra-thin conformal pore-sealing of low-k materials by plasma-assisted ALD," University of New Mexico, Albuquerque, NM, Sandia National Labs, Albuquerque, NM, 1 page.

(Continued)

*Primary Examiner* — Michael G Miller
(74) *Attorney, Agent, or Firm* — Weaver Austin Villeneuve & Sampson LLP

(57) ABSTRACT

Methods and apparatuses for depositing thin films using long and short conversion times during alternating cycles of atomic layer deposition (ALD) are provided herein. Embodiments involve alternating conversion duration of an ALD cycle in one or more cycles of a multi-cycle ALD process. Some embodiments involve modulation of dose, purge, pressure, plasma power or plasma energy in two or more ALD cycles.

20 Claims, 9 Drawing Sheets

Related U.S. Application Data

(60) Provisional application No. 62/841,463, filed on May 1, 2019.

(51) Int. Cl.
 *C23C 16/455* (2006.01)
 *C23C 16/52* (2006.01)

(52) U.S. Cl.
 CPC ........ *C23C 16/45544* (2013.01); *C23C 16/52* (2013.01); *H01L 21/02164* (2013.01); *H01L 21/02211* (2013.01); *H01L 21/02274* (2013.01)

(56) References Cited

U.S. PATENT DOCUMENTS

| | | | |
|---|---|---|---|
| 5,223,443 A | 6/1993 | Chinn et al. |
| 5,318,928 A | 6/1994 | Gegenwart et al. |
| 5,496,608 A | 3/1996 | Matsuda et al. |
| 5,593,914 A | 1/1997 | Evans, Jr. et al. |
| 5,670,432 A | 9/1997 | Tsai |
| 5,856,003 A | 1/1999 | Chiu |
| 5,863,339 A | 1/1999 | Usami |
| 5,874,368 A | 2/1999 | Laxman et al. |
| 5,916,365 A | 6/1999 | Sherman |
| 5,932,286 A | 8/1999 | Beinglass et al. |
| 6,069,058 A | 5/2000 | Hong |
| 6,100,202 A | 8/2000 | Lin et al. |
| 6,156,149 A | 12/2000 | Cheung et al. |
| 6,218,293 B1 | 4/2001 | Kraus et al. |
| 6,270,572 B1 | 8/2001 | Kim et al. |
| 6,346,741 B1 | 2/2002 | Buskirk et al. |
| 6,391,803 B1 | 5/2002 | Kim et al. |
| 6,399,221 B1 | 6/2002 | Marks et al. |
| 6,416,822 B1 | 7/2002 | Chiang et al. |
| 6,428,859 B1 | 8/2002 | Chiang et al. |
| 6,448,192 B1 | 9/2002 | Kaushik |
| 6,465,272 B1 | 10/2002 | Davis, Jr. et al. |
| 6,468,924 B2 | 10/2002 | Lee et al. |
| 6,482,726 B1 | 11/2002 | Aminpur et al. |
| 6,509,601 B1 | 1/2003 | Lee et al. |
| 6,528,430 B2 | 3/2003 | Kwan et al. |
| 6,551,893 B1 | 4/2003 | Zheng et al. |
| 6,569,501 B2 | 5/2003 | Chiang et al. |
| 6,576,053 B1 | 6/2003 | Kim et al. |
| 6,602,784 B2 | 8/2003 | Sneh |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic et al. |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,943,092 B2 | 9/2005 | Kim |
| 6,962,876 B2 | 11/2005 | Ahn et al. |
| 6,987,240 B2 | 1/2006 | Jennings et al. |
| 7,001,844 B2 | 2/2006 | Chakravarti et al. |
| 7,041,335 B2 | 5/2006 | Chung |
| 7,077,904 B2 | 7/2006 | Cho et al. |
| 7,081,271 B2 | 7/2006 | Chung et al. |
| 7,097,886 B2 | 8/2006 | Moghadam et al. |
| 7,109,129 B1 | 9/2006 | Papasouliotis |
| 7,115,166 B2 | 10/2006 | Vaartstra et al. |
| 7,115,528 B2 | 10/2006 | Vaartstra et al. |
| 7,122,222 B2 | 10/2006 | Xiao et al. |
| 7,122,464 B2 | 10/2006 | Vaartstra |
| 7,125,815 B2 | 10/2006 | Vaartstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,211,525 B1 | 5/2007 | Shanker et al. |
| 7,223,649 B2 | 5/2007 | Oh et al. |
| 7,235,484 B2 | 6/2007 | Nguyen et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,625,820 B1 | 12/2009 | Papasouliotis et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,745,346 B2 | 6/2010 | Hausmann et al. |
| 7,758,920 B2 | 7/2010 | Hasebe et al. |
| 7,776,733 B2 | 8/2010 | Hasegawa |
| 7,790,633 B1 | 9/2010 | Tarafdar et al. |
| 7,825,039 B2 | 11/2010 | Takahashi et al. |
| 7,863,190 B1 | 1/2011 | Papasouliotis et al. |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | Van et al. |

(56) References Cited

U.S. PATENT DOCUMENTS

| | | |
|---|---|---|
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,338,312 B2 | 12/2012 | Sato et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B1 | 2/2014 | Lavoie et al. |
| 8,669,185 B2 | 3/2014 | Onizawa et al. |
| 8,728,955 B2 | 5/2014 | Lavoie et al. |
| 8,728,956 B2 | 5/2014 | Lavoie et al. |
| 8,802,882 B2 | 8/2014 | Wang et al. |
| 8,829,636 B2 | 9/2014 | Ohchi et al. |
| 8,846,484 B2 | 9/2014 | Lee et al. |
| 8,956,983 B2 | 2/2015 | Swaminathan et al. |
| 8,999,859 B2 | 4/2015 | Swaminathan et al. |
| 9,023,693 B1 | 5/2015 | Lin et al. |
| 9,076,646 B2 | 7/2015 | Sims et al. |
| 9,214,334 B2 | 12/2015 | Swaminathan et al. |
| 9,230,800 B2 | 1/2016 | Lavoie et al. |
| 9,257,274 B2 | 2/2016 | Kang et al. |
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 9,406,693 B1 | 8/2016 | Pang et al. |
| 9,502,238 B2 | 11/2016 | Danek et al. |
| 9,564,312 B2 | 2/2017 | Henri et al. |
| 9,570,274 B2 | 2/2017 | Swaminathan et al. |
| 9,570,290 B2 | 2/2017 | Swaminathan et al. |
| 9,611,544 B2 | 4/2017 | Lavoie et al. |
| 9,627,221 B1 | 4/2017 | Zaitsu et al. |
| 9,673,041 B2 | 6/2017 | Swaminathan et al. |
| 9,685,320 B2 | 6/2017 | Kang et al. |
| 9,773,643 B1 | 9/2017 | Singhal et al. |
| 9,786,570 B2 | 10/2017 | Kang et al. |
| 9,793,110 B2 | 10/2017 | Kang et al. |
| 9,875,891 B2 | 1/2018 | Henri et al. |
| 9,892,917 B2 | 2/2018 | Swaminathan et al. |
| 9,997,357 B2 | 6/2018 | Arghavani et al. |
| 10,008,428 B2 | 6/2018 | Kang et al. |
| 10,037,884 B2 | 7/2018 | Ou et al. |
| 10,043,655 B2 | 8/2018 | Swaminathan et al. |
| 10,043,657 B2 | 8/2018 | Swaminathan et al. |
| 10,062,563 B2 | 8/2018 | Kumar et al. |
| 10,269,559 B2 | 4/2019 | Abel et al. |
| 10,361,076 B2 | 7/2019 | Kang et al. |
| 10,373,806 B2 | 8/2019 | Singhal et al. |
| 10,559,468 B2 | 2/2020 | Arghavani et al. |
| 10,679,848 B2 | 6/2020 | Kumar et al. |
| 10,741,458 B2 | 8/2020 | Kang et al. |
| 10,804,099 B2 | 10/2020 | Henri et al. |
| 10,957,514 B2 | 3/2021 | Singhal et al. |
| 11,133,180 B2 | 9/2021 | Kang et al. |
| 12,040,181 B2 | 7/2024 | Soe et al. |
| 12,261,038 B2 | 3/2025 | Kang et al. |
| 2001/0028922 A1 | 10/2001 | Sandhu |
| 2002/0066411 A1 | 6/2002 | Chiang et al. |
| 2002/0076507 A1 | 6/2002 | Chiang et al. |
| 2002/0153101 A1 | 10/2002 | Nguyen et al. |
| 2002/0175393 A1 | 11/2002 | Baum et al. |
| 2003/0008070 A1 | 1/2003 | Seutter et al. |
| 2003/0008492 A1 | 1/2003 | Jung et al. |
| 2003/0024477 A1 | 2/2003 | Okuda et al. |
| 2003/0034244 A1 | 2/2003 | Yasar et al. |
| 2003/0092280 A1 | 5/2003 | Lee et al. |
| 2003/0108674 A1 | 6/2003 | Chung et al. |
| 2003/0116421 A1 | 6/2003 | Xu et al. |
| 2003/0134038 A1 | 7/2003 | Paranjpe |
| 2003/0143839 A1 | 7/2003 | Raaijmakers et al. |
| 2003/0200917 A1 | 10/2003 | Vaartstra |
| 2003/0211757 A1 | 11/2003 | Gondhalekar et al. |
| 2003/0216006 A1 | 11/2003 | Li et al. |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0096582 A1 | 5/2004 | Wang et al. |
| 2004/0121164 A1 | 6/2004 | Iacovangelo et al. |
| 2004/0129212 A1 | 7/2004 | Gadgil et al. |
| 2004/0146644 A1 | 7/2004 | Xiao et al. |
| 2004/0151845 A1 | 8/2004 | Nguyen et al. |
| 2004/0157472 A1 | 8/2004 | Sugino et al. |
| 2004/0171280 A1 | 9/2004 | Conley, Jr. et al. |
| 2004/0219746 A1 | 11/2004 | Vaartstra et al. |
| 2004/0219784 A1 | 11/2004 | Kang et al. |
| 2004/0231799 A1 | 11/2004 | Lee et al. |
| 2005/0005851 A1 | 1/2005 | Keshner et al. |
| 2005/0009368 A1 | 1/2005 | Vaartstra |
| 2005/0042865 A1 | 2/2005 | Cabral et al. |
| 2005/0079661 A1 | 4/2005 | Cho et al. |
| 2005/0109276 A1 | 5/2005 | Iyer et al. |
| 2005/0118837 A1 | 6/2005 | Todd et al. |
| 2005/0142795 A1 | 6/2005 | Ahn et al. |
| 2005/0158983 A1 | 7/2005 | Hoshi et al. |
| 2005/0159017 A1 | 7/2005 | Kim et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0230047 A1 | 10/2005 | Collins et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0276930 A1 | 12/2005 | Gates et al. |
| 2005/0282346 A1 | 12/2005 | Barth et al. |
| 2005/0287775 A1 | 12/2005 | Hasebe et al. |
| 2006/0003557 A1 | 1/2006 | Cabral et al. |
| 2006/0009041 A1 | 1/2006 | Iyer et al. |
| 2006/0014384 A1 | 1/2006 | Lee et al. |
| 2006/0030148 A1 | 2/2006 | Seutter et al. |
| 2006/0032442 A1 | 2/2006 | Hasebe |
| 2006/0032443 A1 | 2/2006 | Hasebe et al. |
| 2006/0084283 A1 | 4/2006 | Paranjpe et al. |
| 2006/0088985 A1 | 4/2006 | Haverkort et al. |
| 2006/0105106 A1 | 5/2006 | Balseanu et al. |
| 2006/0165890 A1 | 7/2006 | Kaushal et al. |
| 2006/0178019 A1 | 8/2006 | Senzaki et al. |
| 2006/0183055 A1 | 8/2006 | O'Neill et al. |
| 2006/0199357 A1 | 9/2006 | Wan et al. |
| 2006/0216418 A1 | 9/2006 | Matsuura |
| 2006/0228868 A1 | 10/2006 | Ahn et al. |
| 2006/0281254 A1 | 12/2006 | Lee et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0026540 A1 | 2/2007 | Nooten et al. |
| 2007/0032047 A1 | 2/2007 | Hasebe et al. |
| 2007/0048455 A1 | 3/2007 | Koh et al. |
| 2007/0065576 A1 | 3/2007 | Singh et al. |
| 2007/0087574 A1 | 4/2007 | Gupta et al. |
| 2007/0087581 A1 | 4/2007 | Singh et al. |
| 2007/0116887 A1 | 5/2007 | Faguet |
| 2007/0119370 A1 | 5/2007 | Ma et al. |
| 2007/0134942 A1 | 6/2007 | Ahn et al. |
| 2007/0137572 A1 | 6/2007 | Matsuura et al. |
| 2007/0145483 A1 | 6/2007 | Ono |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0238301 A1 | 10/2007 | Cabral et al. |
| 2007/0243693 A1 | 10/2007 | Nemani et al. |
| 2007/0245959 A1 | 10/2007 | Paterson et al. |
| 2007/0251444 A1 | 11/2007 | Gros-Jean et al. |
| 2007/0259110 A1 | 11/2007 | Mahajani et al. |

(56) References Cited

U.S. PATENT DOCUMENTS

| | | |
|---|---|---|
| 2007/0281495 A1 | 12/2007 | Mallick et al. |
| 2007/0298585 A1 | 12/2007 | Lubomirsky et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0081470 A1 | 4/2008 | Clark |
| 2008/0085610 A1 | 4/2008 | Wang et al. |
| 2008/0087890 A1 | 4/2008 | Ahn et al. |
| 2008/0123394 A1 | 5/2008 | Lee et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0142483 A1 | 6/2008 | Hua et al. |
| 2008/0182417 A1 | 7/2008 | Collins et al. |
| 2008/0207007 A1 | 8/2008 | Thridandam et al. |
| 2008/0213479 A1 | 9/2008 | Chou et al. |
| 2008/0233762 A1 | 9/2008 | Hong |
| 2008/0242077 A1 | 10/2008 | Clark |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0308526 A1 | 12/2008 | Pandhumsoporn et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0155968 A1 | 6/2009 | Min et al. |
| 2009/0163012 A1 | 6/2009 | Clark et al. |
| 2009/0191687 A1 | 7/2009 | Hong et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2009/0286381 A1 | 11/2009 | Van Schravendijk et al. |
| 2009/0286402 A1 | 11/2009 | Xia et al. |
| 2010/0022099 A1 | 1/2010 | Van Nooten et al. |
| 2010/0025824 A1 | 2/2010 | Chen et al. |
| 2010/0048011 A1 | 2/2010 | Yeh et al. |
| 2010/0051578 A1 | 3/2010 | Chang et al. |
| 2010/0051579 A1 | 3/2010 | Kobayashi |
| 2010/0078316 A1 | 4/2010 | Edakawa et al. |
| 2010/0096687 A1 | 4/2010 | Balseanu et al. |
| 2010/0096688 A1 | 4/2010 | Balseanu et al. |
| 2010/0099236 A1 | 4/2010 | Kwon et al. |
| 2010/0099271 A1 | 4/2010 | Hausmann et al. |
| 2010/0102417 A1 | 4/2010 | Ganguli et al. |
| 2010/0120262 A1 | 5/2010 | Vorsa et al. |
| 2010/0124618 A1 | 5/2010 | Kobayashi et al. |
| 2010/0124621 A1 | 5/2010 | Kobayashi et al. |
| 2010/0126667 A1 | 5/2010 | Yin et al. |
| 2010/0136260 A1 | 6/2010 | Matsunaga et al. |
| 2010/0136313 A1 | 6/2010 | Shimizu et al. |
| 2010/0144162 A1 | 6/2010 | Lee et al. |
| 2010/0167555 A1 | 7/2010 | Maula et al. |
| 2010/0190353 A1 | 7/2010 | Nguyen et al. |
| 2010/0197129 A1 | 8/2010 | Ishikawa |
| 2010/0216268 A1 | 8/2010 | Katayama et al. |
| 2010/0221925 A1 | 9/2010 | Lee et al. |
| 2010/0244114 A1 | 9/2010 | Konno et al. |
| 2010/0255218 A1 | 10/2010 | Oka et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0042744 A1 | 2/2011 | Cheng et al. |
| 2011/0064969 A1 | 3/2011 | Chen et al. |
| 2011/0086516 A1 | 4/2011 | Lee et al. |
| 2011/0121354 A1 | 5/2011 | Schmid et al. |
| 2011/0124187 A1 | 5/2011 | Afzali-Ardakani et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0159673 A1 | 6/2011 | Hanawa et al. |
| 2011/0171775 A1 | 7/2011 | Yamamoto et al. |
| 2011/0176967 A1 | 7/2011 | Okuda et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVOIE et al. |
| 2011/0256734 A1 | 10/2011 | Hausmann et al. |
| 2011/0262642 A1 | 10/2011 | Xiao et al. |
| 2011/0298099 A1 | 12/2011 | Lee et al. |
| 2011/0309475 A1 | 12/2011 | Lee |
| 2012/0009802 A1 | 1/2012 | Lavoie et al. |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0064682 A1 | 3/2012 | Jang et al. |
| 2012/0074844 A1 | 3/2012 | York et al. |
| 2012/0077349 A1 | 3/2012 | Li et al. |
| 2012/0086048 A1 | 4/2012 | Park et al. |
| 2012/0108079 A1 | 5/2012 | Mahajani |
| 2012/0113672 A1 | 5/2012 | Dubrow et al. |
| 2012/0122302 A1 | 5/2012 | Weidman et al. |
| 2012/0161405 A1 | 6/2012 | Mohn et al. |
| 2012/0164846 A1 | 6/2012 | Ha et al. |
| 2012/0193693 A1 | 8/2012 | Kanaya |
| 2012/0213940 A1 | 8/2012 | Mallick |
| 2012/0258261 A1 | 10/2012 | Reddy et al. |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0043512 A1 | 2/2013 | Huang et al. |
| 2013/0058161 A1 | 3/2013 | Yamanaka et al. |
| 2013/0058162 A1 | 3/2013 | Yamanaka et al. |
| 2013/0065404 A1 | 3/2013 | Weidman et al. |
| 2013/0071580 A1 | 3/2013 | Weidman et al. |
| 2013/0084688 A1 | 4/2013 | O'Meara et al. |
| 2013/0113073 A1 | 5/2013 | Liu et al. |
| 2013/0115783 A1 | 5/2013 | Kim et al. |
| 2013/0129940 A1 | 5/2013 | Xiao et al. |
| 2013/0164942 A1 | 6/2013 | Kato et al. |
| 2013/0189854 A1 | 7/2013 | Hausmann et al. |
| 2013/0196082 A1 | 8/2013 | Spence et al. |
| 2013/0196516 A1 | 8/2013 | Lavoie et al. |
| 2013/0252437 A1 | 9/2013 | Sano et al. |
| 2013/0302980 A1 | 11/2013 | Chandrashekar et al. |
| 2013/0309415 A1 | 11/2013 | Swaminathan et al. |
| 2013/0319329 A1 | 12/2013 | Li et al. |
| 2013/0323923 A1 | 12/2013 | Koehler et al. |
| 2013/0330935 A1 | 12/2013 | Varadarajan |
| 2013/0344248 A1 | 12/2013 | Clark |
| 2014/0030444 A1 | 1/2014 | Swaminathan et al. |
| 2014/0049162 A1 | 2/2014 | Thomas et al. |
| 2014/0051262 A9 | 2/2014 | Lavoie et al. |
| 2014/0087066 A1 | 3/2014 | Wang et al. |
| 2014/0094035 A1 | 4/2014 | Ji et al. |
| 2014/0106574 A1 | 4/2014 | Kang et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0158580 A1 | 6/2014 | Xiao et al. |
| 2014/0170853 A1 | 6/2014 | Shamma et al. |
| 2014/0182619 A1 | 7/2014 | Goto et al. |
| 2014/0209562 A1 | 7/2014 | LaVoie et al. |

(56) References Cited

U.S. PATENT DOCUMENTS

| | | |
|---|---|---|
| 2014/0216337 A1 | 8/2014 | Swaminathan et al. |
| 2014/0239462 A1 | 8/2014 | Shamma et al. |
| 2014/0262038 A1 | 9/2014 | Wang et al. |
| 2014/0264555 A1 | 9/2014 | Ahn et al. |
| 2014/0273428 A1 | 9/2014 | Shero et al. |
| 2014/0273528 A1 | 9/2014 | Niskanen et al. |
| 2014/0295084 A1 | 10/2014 | Shirai et al. |
| 2014/0302686 A1 | 10/2014 | Pan et al. |
| 2015/0024592 A1 | 1/2015 | Chandrashekar et al. |
| 2015/0031218 A1 | 1/2015 | Karakawa |
| 2015/0041867 A1 | 2/2015 | Han |
| 2015/0048740 A1 | 2/2015 | Valcore, Jr. et al. |
| 2015/0093902 A1 | 4/2015 | Huang et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0249013 A1 | 9/2015 | Arghavani et al. |
| 2015/0294905 A1 | 10/2015 | Wu et al. |
| 2016/0020092 A1* | 1/2016 | Kang ............... H01J 37/32917 |
| | | 438/789 |
| 2016/0064211 A1 | 3/2016 | Swaminathan et al. |
| 2016/0079037 A1 | 3/2016 | Hirano et al. |
| 2016/0079054 A1 | 3/2016 | Chen et al. |
| 2016/0118246 A1 | 4/2016 | Kang et al. |
| 2016/0148800 A1 | 5/2016 | Henri et al. |
| 2016/0148806 A1 | 5/2016 | Henri et al. |
| 2016/0155676 A1 | 6/2016 | Kang et al. |
| 2016/0163539 A9 | 6/2016 | Kang et al. |
| 2016/0163972 A1 | 6/2016 | Swaminathan et al. |
| 2016/0190008 A1 | 6/2016 | Chandrashekar et al. |
| 2016/0240428 A1 | 8/2016 | Tung et al. |
| 2016/0251756 A1 | 9/2016 | Lansalot-Matras et al. |
| 2016/0260584 A1 | 9/2016 | Marakhtanov et al. |
| 2016/0293385 A1 | 10/2016 | Kapoor et al. |
| 2016/0293398 A1 | 10/2016 | Danek et al. |
| 2016/0293838 A1 | 10/2016 | Swaminathan et al. |
| 2016/0322212 A1 | 11/2016 | Kamakura et al. |
| 2016/0322215 A1 | 11/2016 | Shaikh |
| 2016/0322371 A1 | 11/2016 | Yonemochi |
| 2016/0329206 A1 | 11/2016 | Kumar et al. |
| 2016/0329423 A1 | 11/2016 | Kawahara et al. |
| 2016/0336178 A1 | 11/2016 | Swaminathan et al. |
| 2016/0340782 A1 | 11/2016 | Chandrasekharan et al. |
| 2016/0343580 A1 | 11/2016 | Hudson |
| 2016/0365425 A1 | 12/2016 | Chen et al. |
| 2016/0379826 A9 | 12/2016 | Arghavani et al. |
| 2017/0009346 A1 | 1/2017 | Kumar et al. |
| 2017/0062204 A1 | 3/2017 | Suzuki et al. |
| 2017/0092735 A1 | 3/2017 | Hashemi et al. |
| 2017/0103891 A1 | 4/2017 | Lee et al. |
| 2017/0110364 A1 | 4/2017 | Song et al. |
| 2017/0110533 A1 | 4/2017 | Huang et al. |
| 2017/0117134 A1 | 4/2017 | Henri et al. |
| 2017/0117150 A1 | 4/2017 | Liao et al. |
| 2017/0140926 A1 | 5/2017 | Pore et al. |
| 2017/0148628 A1 | 5/2017 | Swaminathan et al. |
| 2017/0170026 A1 | 6/2017 | Hudson et al. |
| 2017/0226637 A1 | 8/2017 | Lubomirsky et al. |
| 2017/0263450 A1 | 9/2017 | Swaminathan et al. |
| 2017/0316988 A1 | 11/2017 | Kang et al. |
| 2017/0323786 A1 | 11/2017 | Kang et al. |
| 2017/0323803 A1 | 11/2017 | Van Schravendijk et al. |
| 2018/0005801 A1 | 1/2018 | Singhal et al. |
| 2018/0005814 A1* | 1/2018 | Kumar ............... C23C 16/345 |
| 2018/0047645 A1 | 2/2018 | Varadarajan et al. |
| 2018/0061628 A1 | 3/2018 | Ou et al. |
| 2018/0108518 A1* | 4/2018 | Noro ............... C23C 16/4586 |
| 2018/0138028 A1 | 5/2018 | Henri et al. |
| 2018/0223429 A1 | 8/2018 | Fukazawa et al. |
| 2018/0247875 A1 | 8/2018 | Kang et al. |
| 2018/0269061 A1 | 9/2018 | Arghavani et al. |
| 2018/0323057 A1 | 11/2018 | Kumar et al. |
| 2019/0024233 A1 | 1/2019 | Kumar et al. |
| 2019/0055645 A1 | 2/2019 | Li et al. |
| 2019/0080903 A1 | 3/2019 | Abel et al. |
| 2019/0279866 A1 | 9/2019 | Pore |
| 2019/0284694 A1 | 9/2019 | Knisley et al. |
| 2019/0311897 A1 | 10/2019 | Kang et al. |
| 2019/0385820 A1 | 12/2019 | Singhal et al. |
| 2019/0385850 A1 | 12/2019 | Arghavani et al. |
| 2021/0301400 A1 | 9/2021 | Lee et al. |
| 2022/0059348 A1 | 2/2022 | Kang et al. |
| 2022/0208543 A1 | 6/2022 | Soe et al. |
| 2022/0238325 A1 | 7/2022 | Agnew et al. |
| 2025/0014890 A1 | 1/2025 | Gupta et al. |

FOREIGN PATENT DOCUMENTS

| | | |
|---|---|---|
| CN | 1768158 A | 5/2006 |
| CN | 1841676 A | 10/2006 |
| CN | 1926668 A | 3/2007 |
| CN | 101006195 A | 7/2007 |
| CN | 101044598 A | 9/2007 |
| CN | 101064272 A | 10/2007 |
| CN | 101255548 A | 9/2008 |
| CN | 101328578 A | 12/2008 |
| CN | 101378007 A | 3/2009 |
| CN | 101416293 A | 4/2009 |
| CN | 101442004 A | 5/2009 |
| CN | 101535524 A | 9/2009 |
| CN | 101736326 A | 6/2010 |
| CN | 101743341 A | 6/2010 |
| CN | 101889331 A | 11/2010 |
| CN | 102005462 A | 4/2011 |
| CN | 102191479 A | 9/2011 |
| CN | 102224573 A | 10/2011 |
| CN | 102471885 A | 5/2012 |
| CN | 102687249 A | 9/2012 |
| CN | 102906304 A | 1/2013 |
| CN | 103137864 A | 6/2013 |
| CN | 103572259 A | 2/2014 |
| CN | 103918068 A | 7/2014 |
| CN | 103928396 A | 7/2014 |
| CN | 104272441 A | 1/2015 |
| CN | 104517892 A | 4/2015 |
| CN | 104576506 A | 4/2015 |
| CN | 105391427 A | 3/2016 |
| CN | 205164805 U | 4/2016 |
| CN | 105609471 A | 5/2016 |
| CN | 105719954 A | 6/2016 |
| CN | 106449360 A | 2/2017 |
| CN | 106548923 A | 3/2017 |
| CN | 109478497 A | 3/2019 |
| EP | 0277766 A2 | 8/1988 |
| EP | 0541212 A2 | 5/1993 |
| EP | 1081754 A2 | 3/2001 |
| EP | 1703552 A2 | 9/2006 |
| EP | 2278046 A1 | 1/2011 |
| JP | S4843472 A | 6/1973 |
| JP | H0293071 A | 4/1990 |
| JP | H0311635 A | 1/1991 |
| JP | H05226279 A | 9/1993 |
| JP | H0684812 A | 3/1994 |
| JP | H06177120 A | 6/1994 |
| JP | H0781271 A | 3/1995 |
| JP | H07176084 A | 7/1995 |
| JP | H09102494 A | 4/1997 |
| JP | H09167755 A | 6/1997 |
| JP | H09219401 A | 8/1997 |
| JP | H1098032 A | 4/1998 |
| JP | H10189467 A | 7/1998 |
| JP | H11172439 A | 6/1999 |
| JP | 2001274404 A | 10/2001 |
| JP | 2001338922 A | 12/2001 |
| JP | 2002009072 A | 1/2002 |
| JP | 2002134497 A | 5/2002 |
| JP | 2002164345 A | 6/2002 |
| JP | 2002235173 A | 8/2002 |
| JP | 2002539640 A | 11/2002 |

(56) References Cited

FOREIGN PATENT DOCUMENTS

| | | |
|---|---|---|
| JP | 2003110021 A | 4/2003 |
| JP | 2003197615 A | 7/2003 |
| JP | 2005136300 A | 5/2005 |
| JP | 2005210076 A | 8/2005 |
| JP | 2005310927 A | 11/2005 |
| JP | 2006060091 A | 3/2006 |
| JP | 2006135029 A | 5/2006 |
| JP | 2006286813 A | 10/2006 |
| JP | 2006303431 A | 11/2006 |
| JP | 2007103950 A | 4/2007 |
| JP | 2007165883 A | 6/2007 |
| JP | 2007180362 A | 7/2007 |
| JP | 2007189173 A | 7/2007 |
| JP | 2007521658 A | 8/2007 |
| JP | 2007287889 A | 11/2007 |
| JP | 2007287890 A | 11/2007 |
| JP | 2008500742 A | 1/2008 |
| JP | 2008506262 A | 2/2008 |
| JP | 2008060455 A | 3/2008 |
| JP | 2008109093 A | 5/2008 |
| JP | 2008517479 A | 5/2008 |
| JP | 2008522405 A | 6/2008 |
| JP | 2008160123 A | 7/2008 |
| JP | 2008182199 A | 8/2008 |
| JP | 2008199052 A | 8/2008 |
| JP | 2008258591 A | 10/2008 |
| JP | 2008294260 A | 12/2008 |
| JP | 2008306093 A | 12/2008 |
| JP | 2009065203 A | 3/2009 |
| JP | 2009170823 A | 7/2009 |
| JP | 4364320 B2 | 11/2009 |
| JP | 2009540128 A | 11/2009 |
| JP | 2010010497 A | 1/2010 |
| JP | 2010043081 A | 2/2010 |
| JP | 2010103484 A | 5/2010 |
| JP | 2010118664 A | 5/2010 |
| JP | 2010152136 A | 7/2010 |
| JP | 2010183069 A | 8/2010 |
| JP | 2010530127 A | 9/2010 |
| JP | 2010245518 A | 10/2010 |
| JP | 2010251654 A | 11/2010 |
| JP | 2010283388 A | 12/2010 |
| JP | 2010539730 A | 12/2010 |
| JP | 2011023576 A | 2/2011 |
| JP | 2011023655 A | 2/2011 |
| JP | 2011035366 A | 2/2011 |
| JP | 2011054968 A | 3/2011 |
| JP | 2011067744 A | 4/2011 |
| JP | 2011187934 A | 9/2011 |
| JP | 2012506640 A | 3/2012 |
| JP | 2012169658 A | 9/2012 |
| JP | 2012199306 A | 10/2012 |
| JP | 2013058521 A | 3/2013 |
| JP | 2013102130 A | 5/2013 |
| JP | 5225081 B2 | 7/2013 |
| JP | 2013166965 A | 8/2013 |
| JP | 2013196822 A | 9/2013 |
| JP | 2013225655 A | 10/2013 |
| JP | 2013240042 A | 11/2013 |
| JP | 2014112668 A | 6/2014 |
| JP | 2014532304 A | 12/2014 |
| JP | 2015029097 A | 2/2015 |
| JP | 2015512568 A | 4/2015 |
| JP | 2016063232 A | 4/2016 |
| JP | 2016066794 A | 4/2016 |
| JP | 2018011050 A | 1/2018 |
| KR | 20010111448 A | 12/2001 |
| KR | 20020048617 A | 6/2002 |
| KR | 100356473 B1 | 10/2002 |
| KR | 20040001036 A | 1/2004 |
| KR | 20040096380 A | 11/2004 |
| KR | 20040097219 A | 11/2004 |
| KR | 20050035354 A | 4/2005 |
| KR | 20060023137 A | 3/2006 |
| KR | 20060056883 A | 5/2006 |
| KR | 100721503 B1 | 5/2007 |
| KR | 20070060104 A | 6/2007 |
| KR | 20070066945 A | 6/2007 |
| KR | 100734748 B1 | 7/2007 |
| KR | 20070088512 A | 8/2007 |
| KR | 20080052499 A | 6/2008 |
| KR | 20080079625 A | 9/2008 |
| KR | 100861851 B1 | 10/2008 |
| KR | 20090033449 A | 4/2009 |
| KR | 20090057665 A | 6/2009 |
| KR | 20090080019 A | 7/2009 |
| KR | 20090081396 A | 7/2009 |
| KR | 20090116433 A | 11/2009 |
| KR | 20090119661 A | 11/2009 |
| KR | 20100106576 A | 10/2010 |
| KR | 20100117205 A | 11/2010 |
| KR | 20100124807 A | 11/2010 |
| KR | 20100133377 A | 12/2010 |
| KR | 20110016916 A | 2/2011 |
| KR | 20110034822 A | 4/2011 |
| KR | 20110086090 A | 7/2011 |
| KR | 20120011825 A | 2/2012 |
| KR | 20130035880 A | 4/2013 |
| KR | 20130049690 A | 5/2013 |
| KR | 20130056608 A | 5/2013 |
| KR | 20130057409 A | 5/2013 |
| KR | 20130062256 A | 6/2013 |
| KR | 20130115261 A | 10/2013 |
| KR | 20130135087 A | 12/2013 |
| KR | 20130135261 A | 12/2013 |
| KR | 20140060253 A | 5/2014 |
| KR | 20140079431 A | 6/2014 |
| KR | 20140126241 A | 10/2014 |
| KR | 20140141686 A | 12/2014 |
| KR | 20150025224 A | 3/2015 |
| KR | 20150037662 A | 4/2015 |
| KR | 20160011149 A | 1/2016 |
| KR | 20160068002 A | 6/2016 |
| KR | 20170007177 A | 1/2017 |
| KR | 101762978 B1 | 7/2017 |
| KR | 20170103117 A | 9/2017 |
| KR | 20180028016 A | 3/2018 |
| SG | 188537 A1 | 4/2013 |
| TW | 483103 B | 4/2002 |
| TW | 200701341 A | 1/2007 |
| TW | 200721306 A | 6/2007 |
| TW | 201009942 A | 3/2010 |
| TW | 201042706 A | 12/2010 |
| TW | 201113934 A | 4/2011 |
| TW | 201140695 A | 11/2011 |
| TW | 201144475 A | 12/2011 |
| TW | 201411776 A | 3/2014 |
| TW | 201430951 A | 8/2014 |
| TW | 201527587 A | 7/2015 |
| TW | 201546896 A | 12/2015 |
| TW | 201621974 A | 6/2016 |
| WO | WO-2004032196 A2 | 4/2004 |
| WO | WO-2006014471 A1 | 2/2006 |
| WO | WO-2006018441 A1 | 2/2006 |
| WO | WO-2006026350 A2 | 3/2006 |
| WO | WO-2006104741 A1 | 10/2006 |
| WO | WO-2007043709 A1 | 4/2007 |
| WO | WO-2007118026 A2 | 10/2007 |
| WO | WO-2011087580 A1 | 7/2011 |
| WO | WO-2011087850 A1 | 7/2011 |
| WO | WO-2011130326 A2 | 10/2011 |
| WO | WO-2011130397 A2 | 10/2011 |
| WO | WO-2012040317 A2 | 3/2012 |
| WO | WO-2012048094 A2 | 4/2012 |
| WO | WO-2012087737 A2 | 6/2012 |
| WO | WO-2013032786 A2 | 3/2013 |
| WO | WO-2013043330 A1 | 3/2013 |
| WO | WO-2013065806 A1 | 5/2013 |
| WO | WO-2013095396 A1 | 6/2013 |
| WO | WO-2013112727 A1 | 8/2013 |
| WO | WO-2013137115 A1 | 9/2013 |
| WO | WO-2013148880 A1 | 10/2013 |

(56) References Cited

FOREIGN PATENT DOCUMENTS

| WO | WO-2018204709 A1 | 11/2018 |
| WO | WO-2020093013 A1 | 5/2020 |
| WO | WO-2020131635 A1 | 6/2020 |

OTHER PUBLICATIONS

Chinese Fifth Office Action dated Jun. 30, 2020 issued in Application No. CN 201510091775.9.
Chinese First Office Action dated Apr. 11, 2016 issued in Application No. CN 201510086588.1.
Chinese First Office Action dated Feb. 22, 2016 issued in Application No. CN 201380006994.1.
Chinese First Office Action dated Jan. 20, 2020 issued in Application No. CN 201710347032.2.
Chinese First Office Action dated Jul. 10, 2020 issued in Application No. CN 201710839679.7.
Chinese First Office Action dated Jun. 2, 2015 issued in Application No. CN 201180045808.6.
Chinese First Office Action dated Mar. 30, 2018 issued in Application No. CN 201610206201.6.
Chinese First Office Action dated May 19, 2016 issued in Application No. CN 201310021460.8.
Chinese First Office Action dated May 27, 2017 issued in Application No. CN 201510091775.9.
Chinese First Office Action dated Nov. 19, 2015 issued in Application No. CN 201280046487.6.
Chinese First Office Action dated Nov. 28, 2016 issued in Application No. CN 201410521390.7.
Chinese First Office Action dated Nov. 6, 2015 issued in Application No. CN 201280053888.4.
Chinese First Office Action dated Oct. 8, 2018 issued in Application No. CN 201710522311.8.
Chinese Fourt Office Action dated May 16, 2018 issued in Application No. CN 201310021460.8.
Chinese Fourth Office Action dated Jul. 5, 2021 issued in Application No. CN 201710347032.2.
Chinese Fourth Office Action dated Mar. 27, 2019 issued in Application No. CN 201510091775.9.
Chinese Notification of Reexamination dated Apr. 17, 2020 issued in Application No. CN 201310021460.8.
Chinese Reexamination Decision dated Sep. 11, 2020 issued in Application No. CN 201310021460.8.
Chinese Second Office Action dated Apr. 12, 2021 issued in Application No. CN 201710839679.7.
Chinese Second Office Action dated Apr. 13, 2017 issued in Application No. CN 201310021460.8.
Chinese Second Office Action dated Aug. 14, 2020 issued in Application No. CN 201710347032.2.
Chinese Second Office Action dated Aug. 16, 2016 issued in Application No. CN 201280053888.4.
Chinese Second Office Action dated Aug. 22, 2016 issued in Application No. CN 201280046487.6.
Chinese Second Office Action dated Feb. 2, 2016 issued in Application No. CN 201180045808.6.
Chinese Second Office Action dated Feb. 6, 2017 issued in Application No. CN 201380006994.1.
Chinese Second Office Action dated Jan. 24, 2019 issued in Application No. CN 201610206201.6.
Chinese Second Office Action dated Jun. 13, 2019 issued in Application No. CN 201710522311.8.
Chinese Second Office Action dated Mar. 20, 2017 issued in Application No. CN 201510086588.1.
Chinese Second Office Action dated Mar. 26, 2018 issued in Application No. CN 201510091775.9.
Chinese Third Office Action dated Dec. 22, 2017, issued in Application No. CN 201380006994.1.
Chinese Third Office Action dated Jan. 6, 2021 issued in Application No. CN 201710347032.2.
Chinese Third Office Action dated Oct. 15, 2018 issued in Application No. CN 201510091775.9.
Chinese Third Office Action dated Oct. 17, 2017 issued in Application No. CN 201310021460.8.
Chinese Third Office Action dated Sep. 15, 2021 issued in Application No. CN 201710839679.7.
Choi, Gyu-Jin et al., (2009) "Plasma-enhanced atomic layer deposition of TiO2 and Al-doped TiO2 films using N2O and O2 reactants," Journal of the Electrochemical Society, 156(9):G138-G143.
CN Office Action dated May 31, 2022 in Application No. CN202010046740.4 with English translation.
CN Office Action dated Feb. 26, 2024 in CN Application No. 202080055513.6, with English Translation.
CN Office Action dated Mar. 30, 2023, in Application No. CN201880073124.9 with English translation.
CN Office Action dated May 22, 2024 in CN Application No. 202011057147.6 with English translation.
CN Office Action dated Oct. 18, 2024 in CN Application No. 201980098159.2 with English translation.
CN Office Action dated Sep. 21, 2023, in Application No. CN201880073124.9 with English translation.
Elam et al., (2003) "Growth of ZnO/Al2O3 Alloy Films Using Atomic Layer Deposition Techniques," Chemistry of Materials, 2003, vol. 15, No. 4, pp. 1020-1028. doi:10.1021/cm020607+.
European Examination Report dated Dec. 11, 2017 issued in Application No. EP 13 15 2046.
European Extended Search Report dated Apr. 14, 2014 issued in Application No. EP13152046.2.
Faraz, T. et al., "Atomic Layer Etching: What Can We Learn from Atomic Layer Deposition?," ECS Journal of Solid State Science and Technology, vol. 4, No. 6, pp. N5023-N5032.
Hausmann et al., (2002) "Atomic Layer Deposition of Hafnium and Zirconium Oxides Using Metal Amide Precursors," Chem. Mater. 14(10):4350-4358.
International Preliminary Report on Patentability and Written Opinion dated Jun. 13, 2024 in PCT Application No. PCT/US2022/080683.
International Preliminary Report on Patentability dated Dec. 16, 2021, for International Application No. PCT/US2020/035996.
International Preliminary Report on Patentability dated Mar. 26, 2020 issued in Application No. PCT/US2018/050049.
International Preliminary Report on Patentability dated Nov. 11, 2021, for International Application No. PCT/US2019/040648.
International Search Report and Written Opinion dated Apr. 14, 2023 in PCT Application No. PCT/US2022/080683.
International Search Report and Written Opinion dated Feb. 25, 2019 issued in Application No. PCT/US2018/050049.
International Search Report and Written Opinion dated Jan. 30, 2020 issued in Application No. PCT/US2019/040648.
Japanese Decision of Refusal dated Dec. 5, 2017 issued in Application No. JP2014-554825.
Japanese Decision of Rejection dated Jan. 9, 2018 issued in Application No. JP 2013-007612.
Japanese Decision to Grant dated Sep. 10, 2018 issued in Application No. JP 2013-230782.
Japanese First Office Action dated Aug. 3, 2021 issued in Application No. JP 2017- 122828.
Japanese First Office Action dated Dec. 18, 2018 issued in Application No. JP 2014-262248.
Japanese First Office Action dated May 29, 2019 issued in Application No. JP 2018-090402.
Japanese First Office Action dated Oct. 31, 2017 issued in Application No. JP 2013-230782.
Japanese Notice of Reason for Refusal dated Jul. 24, 2018 issued in Application No. JP 2017-159931.
Japanese Notification of Reasons for Rejection dated Jan. 10, 2017 issued in Application No. JP2014-554825.
Japanese Office Action dated Apr. 19, 2016 issued in Application No. JP 2015-21804.
Japanese Office Action dated Aug. 23, 2016 issued in Application No. JP 2014-531838.

(56) References Cited

OTHER PUBLICATIONS

Japanese Office Action dated Dec. 5, 2017 issued in Application No. JP 2013-231188.
Japanese Office Action dated Jan. 10, 2017 issued in Application No. JP 2013-007612.
Japanese Reason for Refusal dated Apr. 2, 2019 issued in Application No. JP 2013-007612.
Japanese Second Office Action dated Jun. 17, 2019 issued in Application No. JP 2017-159931.
Japanese Second Office Action dated May 22, 2018 issued in Application No. JP 2013-230782.
Japanese Second Office Action [Decision of Rejection] dated Dec. 4, 2018 issued in Application No. JP 2013-231188.
Japanese Second Office Action [Decision of Rejection] dated Jan. 14, 2020 issued in Application No. JP 2018-090402.
Japanese Third Office Action dated Mar. 10, 2020 issued in Application No. JP 2017-159931.
JP Office Action dated Aug. 29, 2023 in Application No. JP2021-185396 with English Translation.
JP Office Action dated Feb. 7, 2023, in Application No. JP2021-185396 with English translation.
JP Office Action dated Jun. 27, 2023 in Application No. JP2021-564415 with English translation.
JP Office Action dated Oct. 10, 2023 in Application No. JP2021-564415 with English Translation.
JP Office Action dated Oct. 18, 2022, in Application No. JP2020-514992 with English translation.
Kim, H., et al., (2002) "The Growth of Tantalum Thin Films by Plasma-Enhanced Atomic Layer Deposition and Diffusion Barrier Properties," Mat. Res. Soc. Symp. Proc. 716:B8.5.1-B8.5.6.
King, Sean W., (Jul./Aug. 2011) "Plasma enhanced atomic layer deposition of SiNx:H and SiO2," J. Vac. Sci. Technol. A29(4):041501-1 through 041501-9 (9 pages).
Ko, Myoung-Gyun, et al., "Characterization of ruthenium thin film deposited by rf-direct plasma atomic layer deposition," 209th ECS Meeting, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," Journal of the Korean Physical Society, 53(4):2123-2128.
Korean Decision for Grant dated Aug. 19, 2021 issued in Application No. KR 10- 2021-0008342.
Korean Decision for Grant of Patent, dated Jul. 25, 2018, issued in Application No. KR 10-2013-7010291.
Korean Decision for Grant of Patent, dated May 17, 2019 issued in Application No. KR 10-2014-7008696.
Korean Decision for Grant of Patent dated Oct. 20, 2020 issued in Application No. KR 10-2013-0126834.
Korean Decision for Grant of Patent dated Sep. 7, 2020 issued in Application No. KR 10-2013-0135907.
Korean Decision from the Patent Tribunal of the KIPO (description) dated May 26, 2015 issued in Application No. KR 10-2012-0043797.
Korean Final Office Action dated Aug. 18, 2014 issued in Application No. KR 10-2012-0043797.
Korean Final Office Action dated Jun. 29, 2016, issued in Application No. KR 10-2015-0022610.
Korean First Office Action dated Apr. 21, 2021 issued in Application No. KR 10-2014-0131380.
Korean First Office Action dated Apr. 21, 2021, issued in Application No. KR 10-2015-0023868.
Korean First Office Action dated Apr. 7, 2021 issued in Application No. KR 10-2021-0020087.
Korean First Office Action dated Aug. 19, 2019 issued in Application No. KR 10-2019-7012231.
Korean First Office Action dated Aug. 3, 2021 issued in Application No. KR 10-2014-0193925.
Korean First Office Action dated Feb. 19, 2016, issued in Application No. KR 10-2015-0022610.
Korean First Office Action dated Feb. 23, 2021 issued in Application No. KR 10-2021-0008342.
Korean First Office Action dated Jan. 15, 2020 issued in Application No. KR 10-2013-0135907.
Korean First Office Action dated Jun. 28, 2019 issued in Application No. KR 10-2013-0056776.
Korean First Office Action dated May 14, 2020 issued in Application No. KR 10-2013-0135905.
Korean First Office Action dated May 21, 2021 issued in Application No. KR 10-2015-0028413.
Korean First Office Action dated May 27, 2020 issued in Application No. KR 10-2013-0126834.
Korean First Office Action dated Oct. 2, 2018 issued in Application No. KR 10-2014-7010949.
Korean First Office Action dated Oct. 31, 2017 issued in Application No. KR 10-2014-7008696.
Korean Notice of Provisional Rejection dated Dec. 6, 2013 issued in Application No. KR 10-2012-0043797.
Korean Office Action, dated Aug. 23, 2017, issued in Application No. KR 10-2017-7020548.
Korean Office Action, dated Feb. 7, 2017, issued in Application No. KR 10-2012-7004925.
Korean Office Action, dated May 23, 2017, issued in Application No. KR 10-2013-7010291.
Korean Office Action, dated Nov. 27, 2017, issued in Application No. KR 10-2013-7010291.
Korean Second Office Action dated Oct. 22, 2021 issued in Application No. KR 10-2021-0020087.
Korean Second Office Action dated Sep. 20, 2018 issued in Application No. KR 10-2014-7008696.
KR Final Rejection dated Oct. 21, 2021, in application KR10-2021-0020087 with English translation.
KR Notice of Allowances dated Aug. 1, 2024 in KR Application No. 10-2021-7039337 with English translation.
KR Notice of Allowances dated Oct. 17, 2024 in KR Application No. 10-2023-0184996 with English Translation.
KR Office Action dated Dec. 23, 2022 in Application No. KR10-2022-0068027 With English Translation.
KR Office Action dated Feb. 15, 2022, in Application No. KR10-2017-0077085 with English Translation.
KR Office action dated Aug. 8, 2022 in KR Application No. KR10-2015-0162556 with English translation.
KR Office Action dated Aug. 17, 2023, in application No. KR10-2016-0039946 with English translation.
KR Office Action dated Aug. 30, 2023, in Application No. KR10-2020-7010492 with English Translation.
KR Office Action dated Dec. 17, 2021, in Application No. KR1020210020087 with English translation.
KR Office Action dated Feb. 5, 2024 in KR Application No. 10-2023-0184996, with EnglishTranslation.
KR Office Action dated Feb. 7, 2022, in Application No. KR1020150023868 with English translation.
KR Office action dated Feb. 24, 2023 in KR Application No. KR10-2015-0162556 with English translation.
KR Office Action dated Jan. 5, 2023 in Application No. KR10-2016-0039946 with English translation.
KR Office Action dated Jan. 14, 2022, in Application No. KR1020140193925 with English translation.
KR Office Action dated Jan. 18, 2023 in Application No. KR10-2022-0059033 with English translation.
KR Office Action dated Jul. 21, 2023, in Application No. KR10-2022-0068027 with English translation.
KR Office Action dated Jun. 8, 2022, in Application No. KR10-2015-0099945 with English translation.
KR Office Action dated May 3, 2023, in Application No. KR10-2022-0114140 with English Translation.
KR Office Action dated May 20, 2022, in Application No. KR10-2022-0023506 with English translation.
KR Office Action dated Nov. 23, 2021, in Application No. KR1020140131380 with English translation.
KR Office Action dated Nov. 26, 2023 in KR Application No. 10-2021-7039337, with English Translation.

(56) References Cited

OTHER PUBLICATIONS

KR Office Action dated Nov. 28, 2024 in KR Application No. 10-2022-7000598, with English Translation.
KR Office Action dated Oct. 19, 2022, 2022, in Application No. KR10-2022- 0023506 with English translation.
KR Office Action dated Oct. 28, 2021, in Application No. KR1020150099945 with English translation.
KR Office Action dated Sep. 5, 2023, in Application No. KR10-2023-0008206 with English Translation.
KR Office Action dated Sep. 16, 2021, in application No. KR1020170077085.
KR Office Action dated Sep. 27, 2024 in KR Application No. 10-2020-7010492 with English Translation.
Kwon, J., et al., (Nov. 2011) "Tracking by Sampling Trackers" 2011 International Conference on Computer Vision. IEEE, 2011, pp. 1195-1202.
Lavareda et al., (2004) "Properties of a-Si:H TFTs using silicon carbonitride as dielectric," Journal of Non-Crystalline Solids, 338-340:797-801.
Lee et al., (2005) "Chemically conformal deposition of SrTiO3 thin films by Atomic Layer Deposition using conventional metal organic precursors and remote-plasma activated H2O," School of Materials Science and Engineering, and Inter-university Semiconductor Research Center, Seoul National University, Microelectronic Engineering 80:158-161.
Lee, Jong Ju, (2005) "Low-impurity, highly conformal atomic layer deposition of titanium nitride using NH3—Ar—H2 plasma treatment for capacitor electrodes," Materials Letters, 59:615-617.
Li, Xingcun, et al., (2011) "Atomic Layer Deposition A1203 Thin Films in Magnetized Radio Frequency Plasma Source," Physics Procedia 18:100-106.
Man P.F. et al., (Feb. 11-15, 1996) "Elimination of Post-Release Adhesion in Microstructures Using Conformal Fluorocarbon Coatings," MEMS '96 Proceedings, IEEE, pp. 55-60.
Nguyen, S.V. et al., (Jan./Mar. 1999) "Plasma-assist chemical vapor deposition of dielectric thin films for ULSI semiconductor circuits," IBM J.Res.Develop. 43(1.2):5-38.
Notice of Allowance dated Feb. 7, 2020 issued in U.S. Appl. No. 16/034,022.
Notice of Allowance dated Sep. 2, 2021 in U.S. Appl. No. 16/428,067.
PCT International Preliminary Report on Patentability and Written Opinion dated Apr. 3, 2014, issued in Application No. PCT/US2012/052769.
PCT International Preliminary Report on Patentability and Written Opinion dated Apr. 4, 2013 issued in Application No. PCT/US2011/052537.
PCT International Preliminary Report on Patentability and Written Opinion dated Aug. 7, 2014, issued in Application No. PCT/US2013/022977.
PCT International Preliminary Report on Patentability and Written Opinion dated Mar. 13, 2014, issued in Application No. PCT/US2012/051740.
PCT International Preliminary Report on Patentability and Written Opinion, dated Oct. 26, 2012, issued in PCT/US2011/032303.
PCT International Preliminary Report on Patentability, dated Oct. 26, 2012, issued in Application No. PCT/US2011/032186.
PCT International Search Report and Written Opinion dated Dec. 18, 2012, issued in Application No. PCT/US2012/052769.
PCT International Search Report and Written Opinion, dated Feb. 20, 2012, issued in PCT/US2011/032303.
PCT International Search Report and Written Opinion dated Feb. 28, 2013, issued in Application No. PCT/US2012/051740.
PCT International Search Report and Written Opinion dated May 2, 2012 issued in Application No. PCT/US2011/052537.
PCT International Search Report and Written Opinion dated May 27, 2013, issued in Application No. PCT/US2013/022977.
PCT International Search Report and Written Opinion, dated Oct. 20, 2011, issued in Application No. PCT/US2011/032186.
PCT Invitation to Pay Additional Fees; Communication Re Partial International Search, dated Dec. 16, 2011, issued in Application No. PCT/US2011/032303.
Plasma Enhanced Atomic Layer Deposition (PEALD), Website: http://www.asm.com/index.php?option=com_content&task=view&id=19&Itemid=161 (2010), 1 page.
"PlasmaProTM NGP®80 Range," Oxford Instruments (2010), 8 pages.
Pritchett, Merry, (May 2004) "Adherence/Diffusion Barrier Layers for Copper Metallization: Amorphous Carbon:Silicon Polymerized Films," Dissertation Prepared for the Degree of Doctor of Philosophy, University of Texas, 113pp.
Profijt, H.B., et al., "Plasma-Assisted Atomic Layer Deposition: Basics, Opportunities, and Challenges," J. Vac. Sci. Technol. A, vol. 29, No. 5 (Sep./Oct. 2011), pp. 1-26.
Puurunen, Riikka L. (2005) "Surface chemistry of atomic layer deposition: A case study for the trimethylaluminum/water process," Journal of Applied Physics, 97:121301-1--121301-52.
SG Search report and Written Opinion dated Aug. 15, 2023 in Application No. SG11202111962Q.
SG Search report and Written Opinion dated Jul. 14, 2023 in Application No. SG11202113475T.
Singapore Eligibility to Grant w/Supplemental Examination Report dated Apr. 23, 2019 issued in Application No. SG 10201408801Q.
Singapore Notice of Eligibility and Examination Report dated Nov. 6, 2020 issued in Application No. SG 10201807090Q.
Singapore Search Report and Written Opinion dated Mar. 14, 2019 issued in Application No. SG 10201807090Q.
Singapore Search Report and Written Opinion dated May 19, 2020 issued in Application No. SG 10201607194P.
Singapore Second Written Opinion dated Jan. 24, 2020 issued in Application No. SG 10201807090Q.
Singapore Supplementary Examination Report dated Aug. 11, 2016 issued in Application No. SG 11201404315R.
Singapore Supplementary Examination Report dated Jun. 1, 2016 issued in Application No. SG 11201400633R.
Taiwan Examination Report dated Jan. 11, 2017 issued in Application No. TW 102138326.
Taiwan Examination Report dated Jul. 13, 2017 issued in Application No. TW 102140721.
Taiwan Examination Report dated Mar. 29, 2017 issued in Application No. TW 102102054.
Taiwan First Office Action dated Jun. 26, 2018 issued in Application No. TW 103145386.
Taiwan First Office Action dated Mar. 14, 2018 issued in Application No. TW 106122777.
Taiwan First Office Action dated May 3, 2018 issued in Application No. TW 103133765.
Taiwan First Office Action dated Oct. 16, 2019 issued in Application No. TW 105109955.
Taiwan First Office Action dated Sep. 13, 2018, issued in Application No. TW 104104648.
Taiwan First Office Action dated Sep. 20, 2018 issued in Application No. TW 106140906.
Taiwan Notice of Allowance and Search Report dated Aug. 30, 2018 issued in Application No. TW 104104471.
Taiwan Notice of Allowance and Search Report dated Dec. 18, 2015 issued in Application No. TW 101134692.
Taiwan Notice of Allowance dated Jul. 2, 2020, issued in Application No. TW 108119661.
Taiwan Office Action and Search Report dated Jan. 27, 2016 issued in Application No. TW 101131556.
Taiwan Office Action and Search Report dated Jul. 20, 2016 issued in Application No. TW 102102879.
Taiwan Office Action and Search Report dated Nov. 9, 2016 issued in Application No. TW 101131556.
Taiwan Office Action dated Apr. 27, 2016 issued in Application No. TW 100113041.
Taiwan Office Action dated May 5, 2016 issued in Application No. TW 100134208.
Taiwan Office Action dated Oct. 19, 2017 issued in Application No. TW 105130207.

(56) References Cited

OTHER PUBLICATIONS

Taiwan Office Action dated Oct. 25, 2016 issued in Application No. TW 102117772.
Taiwan Rejection Decision dated Aug. 17, 2017 issued in Application No. TW 102117772.
Taiwan Second Office Action dated Dec. 14, 2018 issued in Application No. TW 106122777.
Taiwanese First Office Action dated Dec. 21, 2020 issued in Application No. TW 106121191.
Taiwanese First Office Action dated Nov. 9, 2018 issued in Application No. TW 104122669.
Taiwanese First Office Action dated Sep. 14, 2018 issued in Application No. TW 104106165.
TW Office Action dated Aug. 31, 2022 In Application No. TW110129265 With English translation.
TW Office Action dated Jun. 17, 2022 in Application No. TW107131673 With English Translation.
TW Office Action dated Aug. 24, 2023, in application No. TW108123910 with English Translation.
TW Office Action dated Jan. 30, 2023 in Application No. TW108123910 with English translation.
U.S Advisory Action dated Dec. 4, 2013 in U.S. Appl. No. 13/084,399.
US Examiner's Answer to Appeal Brief (filed May 22, 2014) Before the Patent Trial and Appeal Board dated Aug. 14, 2014 issued U.S. Appl. No. 13/224,240.
US Final Office Action dated Apr. 25, 2013 issued in U.S. Appl. No. 13/084,305.
US Final Office Action dated Aug. 20, 2020 issued in U.S. Appl. No. 16/453,237.
US Final Office Action dated Aug. 24, 2016 issued in U.S. Appl. No. 14/335,785.
US Final Office Action dated Dec. 16, 2015 issued in U.S. Appl. No. 14/187,145.
US Final Office Action dated Dec. 4, 2017 issued in U.S. Appl. No. 15/609,864.
US Final Office Action dated Feb. 26, 2013 issued in U.S. Appl. No. 13/011,569.
US Final Office Action dated Jan. 15, 2015 issued in U.S. Appl. No. 14/144,107.
US Final Office Action dated Jan. 21, 2020 issued in U.S. Appl. No. 15/847,744.
US Final Office Action dated Jun. 10, 2015 issued in U.S. Appl. No. 14/231,554.
US Final Office Action dated Jun. 28, 2017 issued in U.S. Appl. No. 13/963,212.
US Final Office Action dated Mar. 18, 2016 issued U.S. Appl. No. 14/607,997.
US Final Office Action dated Nov. 1, 2016 issued in U.S. Appl. No. 14/194,549.
US Final Office Action dated Nov. 16, 2018 issued in U.S. Appl. No. 15/683,397.
US Final Office Action dated Nov. 22, 2013 issued U.S. Appl. No. 13/224,240.
US Final Office Action dated Nov. 24, 2014 issued in U.S. Appl. No. 13/953,616.
US Final Office Action dated Sep. 13, 2013 issued in U.S. Appl. No. 13/084,399.
US Final Office Action dated Sep. 20, 2017 issued in U.S. Appl. No. 14/194,549.
US Final Office Action dated Sep. 25, 2020 issued in U.S. Appl. No. 16/556,122.
US Final Office Action dated Sep. 27, 2019 issued in U.S. Appl. No. 16/034,022.
U.S. Non-Final Office Action dated Aug. 17, 2023, in U.S. Appl. No. 17/594,816.
U.S. Non-Final Office Action dated Jun. 4, 2024 in U.S. Appl. No. 17/465,555.
U.S. Non-Final Office Action dated Sep. 23, 2024 in U.S. Appl. No. 17/596,096.
US Notice of Allowance [Corrected Notice of Allowability] dated Apr. 19, 2017 issued in U.S. Appl. No. 14/335,785.
US Notice of Allowance [Corrected Notice of Allowability] dated Nov. 28, 2017 issued in U.S. Appl. No. 15/224,347.
US Notice of Allowance dated Apr. 18, 2017 issued in U.S. Appl. No. 15/178,474.
US Notice of Allowance dated Apr. 9, 2018 issued in U.S. Appl. No. 15/201,221.
US Notice of Allowance dated Aug. 22, 2017 issued in U.S. Appl. No. 14/987,542.
US Notice of Allowance dated Aug. 31, 2015 issued in U.S. Appl. No. 14/231,554.
US Notice of Allowance dated Aug. 5, 2015 issued in U.S. Appl. No. 14/183,287.
US Notice of Allowance dated Aug. 7, 2014 issued U.S. Appl. No. 14/133,239.
US Notice of Allowance dated Dec. 5, 2018 issued in U.S. Appl. No. 15/703,917.
US Notice of Allowance dated Feb. 10, 2017 issued in U.S. Appl. No. 15/178,474.
US Notice of Allowance dated Feb. 11, 2016 issued in U.S. Appl. No. 14/061,587.
US Notice of Allowance dated Feb. 12, 2016 issued in U.S. Appl. No. 14/074,596.
US Notice of Allowance dated Feb. 14, 2018 issued in U.S. Appl. No. 14/194,549.
US Notice of Allowance dated Feb. 22, 2017 issued in U.S. Appl. No. 14/335,785.
US Notice of Allowance dated Feb. 25, 2016 issued in U.S. Appl. No. 14/187,145.
US Notice of Allowance dated Jan. 15, 2014 issued in U.S. Appl. No. 13/084,399.
US Notice of Allowance dated Jan. 29, 2018 issued in U.S. Appl. No. 15/650,662.
US Notice of Allowance dated Jul. 15, 2016 issued in U.S. Appl. No. 14/678,736.
US Notice of Allowance dated Jul. 26, 2013, issued U.S. Appl. No. 13/414,619.
US Notice of Allowance dated Jun. 15, 2017 issued in U.S. Appl. No. 15/015,952.
US Notice of Allowance dated Jun. 16, 2016 issued U.S. Appl. No. 14/607,997.
US Notice of Allowance dated Jun. 19, 2013 issued U.S. Appl. No. 13/242,084.
US Notice of Allowance dated Jun. 20, 2017 issued in U.S. Appl. No. 14/987,542.
US Notice of Allowance dated Jun. 27, 2017 issued in U.S. Appl. No. 15/199,608.
U.S. Notice of Allowance dated Mar. 13, 2024 in U.S. Appl. No. 17/594,816.
US Notice of Allowance dated Mar. 19, 2015 issued in U.S. Appl. No. 14/144,107.
US Notice of Allowance dated Mar. 21, 2017 issued in U.S. Appl. No. 14/335,785.
US Notice of Allowance dated Mar. 24, 2021 issued in U.S. Appl. No. 16/428,067.
US Notice of Allowance dated Mar. 26, 2018 issued in U.S. Appl. No. 15/253,301.
US Notice of Allowance dated Mar. 27, 2017 issued in U.S. Appl. No. 15/178,474.
US Notice of Allowance dated Mar. 28, 2018 issued in U.S. Appl. No. 15/426,889.
US Notice of Allowance dated Mar. 28, 2019 issued in U.S. Appl. No. 15/683,397.
US Notice of Allowance dated Mar. 30, 2020 issued in U.S. Appl. No. 15/965,628.
US Notice of Allowance dated Mar. 7, 2019 issued in U.S. Appl. No. 15/654,186.
US Notice of Allowance dated Mar. 9, 2018 issued in U.S. Appl. No. 15/609,864.
US Notice of Allowance dated May 28, 2020 issued in U.S. Appl. No. 15/847,744.

(56) References Cited

OTHER PUBLICATIONS

US Notice of Allowance dated May 6, 2013 issued in U.S. Appl. No. 13/011,569.
U.S. Notice of Allowance dated Nov. 13, 2024 in U.S. Appl. No. 17/465,555.
US Notice of Allowance dated Nov. 17, 2016 issued U.S. Appl. No. 13/224,240.
US Notice of Allowance dated Nov. 19, 2014 issued in U.S. Appl. No. 13/607,386.
US Notice of Allowance dated Nov. 20, 2015 issued in U.S. Appl. No. 14/074,617.
US Notice of Allowance dated Nov. 26, 2014 issued U.S. Appl. No. 14/133,239.
US Notice of Allowance dated Nov. 4, 2016 issued in U.S. Appl. No. 14/335,785.
US Notice of Allowance dated Nov. 4, 2020 issued in U.S. Appl. No. 16/453,237.
US Notice of Allowance dated Oct. 1, 2015 issued in U.S. Appl. No. 14/137,860.
US Notice of Allowance dated Oct. 13, 2016 issued in U.S. Appl. No. 15/019,904.
US Notice of Allowance dated Oct. 3, 2019 issued in U.S. Appl. No. 15/976,793.
US Notice of Allowance dated Oct. 4, 2013 issued U.S. Appl. No. 13/472,282.
US Notice of Allowance dated Oct. 4, 2017 issued in U.S. Appl. No. 15/224,347.
US Notice of Allowance dated Oct. 8, 2014 issued in U.S. Appl. No. 13/607,386 .
US Notice of Allowance dated Sep. 19, 2013 issued U.S. Appl. No. 13/242,084.
US Notice of Allowance dated Sep. 26, 2016 issued in U.S. Appl. No. 14/552,011.
US Notice of Allowance dated Sep. 27, 2016 issued in U.S. Appl. No. 14/607,997.
US Notice of Allowance dated Sep. 28, 2017 issued in U.S. Appl. No. 15/399,637.
US Notice of Allowance dated Sep. 30, 2011 issued in U.S. Appl. No. 12/889,132.
US Notice of Allowance (Supplemental Notice of Allowability) dated Feb. 21, 2017 issued U.S. Appl. No. 13/224,240.
US Notice of Allowance [Supplemental Notice of Allowability] dated Mar. 1, 2016 issued in U.S. Appl. No. 14/061,587.
US Notice of Allowance [Supplemental Notice of Allowability] dated Oct. 22, 2015 issued in U.S. Appl. No. 14/137,860.
US Office Action dated Apr. 1, 2020 issued in U.S. Appl. No. 16/556,122.
US Office Action dated Apr. 13, 2015 issued in U.S. Appl. No. 14/335,785.
US Office Action dated Apr. 19, 2017 issued in U.S. Appl. No. 14/194,549.
US Office Action dated Apr. 29, 2013 issued U.S. Appl. No. 13/224,240.
US Office Action dated Apr. 4, 2013 issued U.S. Appl. No. 13/242,084.
US Office Action dated Apr. 13, 2011 issued in U.S. Appl No. 12/889,132.
US Office Action dated Aug. 1, 2012 issued in U.S. Appl. No. 13/011,569.
US Office Action dated Aug. 1, 2016 issued in U.S. Appl. No. 14/932,869.
US Office Action dated Aug. 14, 2015 issued in U.S. Appl. No. 14/061,587.
US Office Action dated Aug. 18, 2017 issued in U.S. Appl. No. 15/201,221.
US Office Action dated Aug. 22, 2017 issued in U.S. Appl. No. 15/609,864.
US Office Action dated Dec. 11, 2014 issued in U.S. Appl. No. 14/074,596.
US Office Action dated Dec. 24, 2015 issued in U.S. Appl. No. 14/074,596.
US Office Action dated Dec. 30, 2016 issued in U.S. Appl. No. 15/015,952.
US Office Action dated Dec. 7, 2020 issued in U.S. Appl. No. 16/428,067.
US Office Action dated Feb. 14, 2020 issued in U.S. Appl. No. 16/453,237.
US Office Action dated Feb. 3, 2017 issued in U.S. Appl. No. 14/987,542.
US Office Action dated Jan. 12, 2017 issued in U.S. Appl. No. 13/963,212.
US Office Action dated Jan. 2, 2015 issued in U.S. Appl. No. 14/231,554.
US Office Action dated Jan. 24, 2018 issued in U.S. Appl. No. 13/963,212.
US Office Action dated Jan. 26, 2018 issued in U.S. Appl. No. 15/683,397.
US Office Action dated Jul. 1, 2016 issued in U.S. Appl. No. 13/963,212.
US Office Action dated Jul. 10, 2014 issued in U.S. Appl. No. 14/144,107.
US Office Action dated Jul. 18, 2018 issued in U.S. Appl. No. 15/703,917.
US Office Action dated Jul. 2, 2015 issued in U.S. Appl. No. 14/187,145.
US Office Action dated Jul. 30, 2019 issued in U.S. Appl. No. 15/847,744.
US Office Action dated Jun. 13, 2014 issued in U.S. Appl. No. 13/953,616.
US Office Action dated Jun. 14, 2016 issued in U.S. Appl. No. 15/019,904.
US Office Action dated Jun. 7, 2013 issued U.S. Appl. No. 13/414,619.
US Office Action dated Jun. 9, 2017 issued in U.S. Appl. No. 15/224,347.
US Office Action dated Mar. 15, 2013 issued in U.S. Appl. No. 13/084,399.
US Office Action dated Mar. 2, 2015 issued in U.S. Appl. No. 14/137,860.
US Office Action dated Mar. 21, 2019 issued in U.S. Appl. No. 15/976,793.
US Office Action dated Mar. 21, 2019 issued in U.S. Appl. No. 16/034,022.
US Office Action dated May 15, 2015 issued in U.S. Appl. No. 14/074,617.
US Office Action dated May 21, 2014 issued in U.S. Appl. No. 13/607,386.
US Office Action dated May 24, 2013 issued U.S. Appl. No. 13/472,282.
US Office Action dated May 25, 2016 issued in U.S. Appl. No. 14/552,011.
US Office Action dated Nov. 25, 2016 issued in U.S. Appl. No. 15/178,474.
US Office Action dated Nov. 9, 2018 issued in U.S. Appl. No. 15/654,186.
US Office Action dated Oct. 1, 2019 issued in U.S. Appl. No. 15/965,628.
US Office Action dated Oct. 21, 2015 issued in U.S. Appl. No. 14/194,549.
US Office Action dated Oct. 6, 2017 issued in U.S. Appl. No. 15/253,301.
US Office Action dated Sep. 14, 2012 issued in U.S. Appl. No. 13/084,305.
US Office Action dated Sep. 21, 2015 issued U.S. Appl. No. 14/607,997.
US Office Action dated Sep. 26, 2017 issued in U.S. Appl. No. 15/426,889.
U.S. Pat. Appl. No. U.S. Appl. No. 16/036,784, inventors Ou et al., filed on Jul. 16, 2018.
U.S. Appl. No. 18/709,780, inventors Gupta A., et al., filed on May 13, 2024.
US Patent Board Decision on Appeal Before the Patent Trial and Appeal Board (Examiner Affirmed) dated Aug. 11, 2016 issued U.S. Appl. No. 13/224,240.

(56) References Cited

OTHER PUBLICATIONS

U.S. Restriction Requirement dated Aug. 7, 2020 in U.S. Appl. No. 16/428,067.
U.S. Restriction Requirement dated Oct. 21, 2016 in U.S. Appl. No. 14/987,542.
U.S. Restriction requirement dated Jun. 8, 2023 in U.S. Appl. No. 17/594,816.
U.S. Supplementary Notice of Allowance dated Apr. 17, 2019 in U.S. Appl. No. 15/654,186.
van der Straten et al., (2004) "Atomic layer deposition of tantalum nitride for ultrathin liner applications in advanced copper metallization schemes," Journal of Materials Research, 19(2):447-453.
CN Office Action dated Jan. 26, 2025 in CN Application No. 202011057147.6, with English Translation.
CN Office Action dated Jan. 27, 2025 in CN Application No. 202080055513.6, with English Translation.
JP Office Action dated Feb. 12, 2025 in JP Application No. 2023-215357, with English Translation.
KR Decision to Grant and Search Report dated Mar. 27, 2025 in KR Application No. 10-2020-7010492, with English translation.
U.S. Final Office Action dated Feb. 27, 2025 in U.S. Appl. No. 17/596,096.
U.S. Supplemental Notice of Allowance dated Feb. 20, 2025 in U.S. Appl. No. 17/465,555.

\* cited by examiner

MODULATED ATOMIC LAYER DEPOSITION

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Films of various materials, including silicon oxide films, are used in semiconductor processing for a variety of applications. Silicon oxide films may be deposited using different techniques, such as plasma-enhanced atomic layer deposition. As technology advances, deposition of high quality films becomes challenging.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Provided herein are methods and apparatuses for depositing films. One embodiment involves a method of depositing a film, the method including: providing a substrate to a process chamber; depositing a first amount of a material over the substrate in a first atomic layer deposition (ALD) cycle, a cycle including: exposing the substrate to a precursor under conditions allowing the precursor to adsorb onto a surface of the substrate, thereby forming a first adsorbed layer of the precursor, and exposing the first adsorbed layer of the precursor to reactive species for a first duration to form the first amount of the material; and depositing a second amount of the material on the first amount of the material using a second ALD cycle, a cycle including: exposing the substrate to the precursor under conditions allowing the precursor to adsorb onto a surface of the substrate, thereby forming a second adsorbed layer of the precursor, and exposing the second adsorbed layer of the precursor to reactive species for a second duration to form the second amount of the material, whereby first duration and the second duration are different durations.

In various embodiments, the second duration is between about 1.1 and about 15 times longer than the first duration.

In various embodiments, the second duration is between about 1.1 and about 10 times longer than the first duration.

In various embodiments, the second duration is between about 1.1 and about 5 times longer than the first duration.

The method may also include igniting a plasma to generate the reactive species. The plasma may be generated in situ. In some embodiments, the plasma is generated remotely.

In various embodiments, the reactive species is introduced with argon.

The method may also include repeating the first ALD cycle two or more times before depositing the second amount of the material.

In some embodiments, the method also includes repeating the second ALD cycle two or more times.

The method may also include alternating between the first and second ALD cycles.

In some embodiments, the method also includes purging after exposing the substrate to the precursor in at least one of the first and the second ALD cycles.

In various embodiments, the precursor is an aminosilane. For example, in some embodiments, the aminosilane is di-isopropylaminosilane (DIPAS).

In various embodiments, the material includes silicon oxide.

Another aspect involves a method of depositing silicon oxide, the method including: providing a substrate to a process chamber; and depositing a conformal silicon oxide film over the substrate by exposing the substrate to two or more plasma-enhanced atomic layer deposition (PEALD) cycles including at least a first PEALD cycle and a second PEALD cycle, whereby a first PEALD cycle includes: introducing a silicon-containing precursor to form an adsorbed layer of the silicon-containing precursor on a surface of the substrate, exposing the adsorbed layer of the silicon-containing precursor to an oxygen-containing reactant and argon and igniting a first plasma at a first plasma energy, and whereby a second PEALD cycle includes: introducing the silicon-containing precursor to form an adsorbed layer of the silicon-containing precursor on a surface of the substrate, exposing the adsorbed layer of the silicon-containing precursor to an oxygen-containing reactant and argon and igniting a second plasma at a second plasma energy, whereby the second plasma energy is at least three times greater than the first plasma energy.

In various embodiments, the first plasma energy is between about 200 J and about 500 J per substrate.

In various embodiments, the first PEALD cycle and second PEALD cycle are performed in sequentially alternating exposures.

In various embodiments, the second PEALD cycle is performed every n times the first PEALD cycle is repeated, whereby n is an integer greater than or equal to 2.

The method may also include a third PEALD cycle performed at a third plasma energy, whereby the first plasma energy is less than the second plasma energy and the second plasma energy is less than the third plasma energy.

In various embodiments, plasma power used to generate the first plasma energy and second plasma energy is the same.

In some embodiments, the silicon-containing precursor is an aminosilane. For example, the aminosilane may be di-isopropylaminosilane (DIPAS).

In various embodiments, the second plasma is generated using a plasma power between about 125 W to about 1625 W per substrate.

In some embodiments, the conformal silicon oxide film has a wet etch rate in 200:1 dilute hydrofluoric acid of less than 1 Å/sec.

Another aspect involves an apparatus for processing substrates, the apparatus including: one or more process chambers; one or more gas inlets into the one or more process chambers and associated flow control hardware; and a controller having at least one processor and a memory, whereby the at least one processor and the memory are communicatively connected with one another, the at least one processor is at least operatively connected with the flow control hardware, and the memory stores computer-executable instructions for controlling the at least one processor to at least control the flow control hardware to: cause insertion of a substrate to at least one of the one or more process chambers; cause introduction of a first set of alternating flows of a silicon-containing precursor and an oxidant into the at least one of the one or more process chambers via the one or more gas inlets for a first duration; and cause introduction of a second set of alternating flows of the silicon-containing precursor and the oxidant into the at least one of the one or more process chambers via the one or more gas inlets for a second duration, whereby the second duration is at least 1.1 times longer than the first duration.

The apparatus may also include a plasma generator.

In various embodiments, the at least one of the one or more process chambers includes a powered showerhead and a grounded pedestal to hold the substrate.

In various embodiments, the at least one of the one or more process chambers includes a powered pedestal to hold the substrate and a grounded showerhead.

Another aspect involves an apparatus for processing substrates, the apparatus including: one or more process chambers; one or more gas inlets into the one or more process chambers and associated flow control hardware; a plasma generator; and a controller having at least one processor and a memory, whereby the at least one processor and the memory are communicatively connected with one another, the at least one processor is at least operatively connected with the flow control hardware, and the memory stores computer-executable instructions for controlling the at least one processor to at least control the flow control hardware to: cause insertion of a substrate to at least one of the one or more process chambers; cause introduction of a first set of alternating flows of a silicon-containing precursor and an oxidant into the at least one of the one or more process chambers via the one or more gas inlets; cause generation of a plasma having a first plasma energy when causing introduction of the oxidant during the first set to form a conformal silicon oxide material; and cause introduction of a second set of alternating flows of the silicon-containing precursor and the oxidant into the at least one of the one or more process chambers via the one or more gas inlets; and cause generation of a plasma having a second plasma energy at least 1.1 times greater than the first plasma energy when introducing the oxidant during the second set to form a conformal silicon oxide material.

In various embodiments, the at least one of the one or more process chambers includes a powered showerhead and a grounded pedestal to hold the substrate.

In various embodiments, the at least one of the one or more process chambers includes a powered pedestal to hold the substrate and a grounded showerhead.

These and other aspects are described further below with reference to the drawings.

DETAILED DESCRIPTION

Figure 1A:
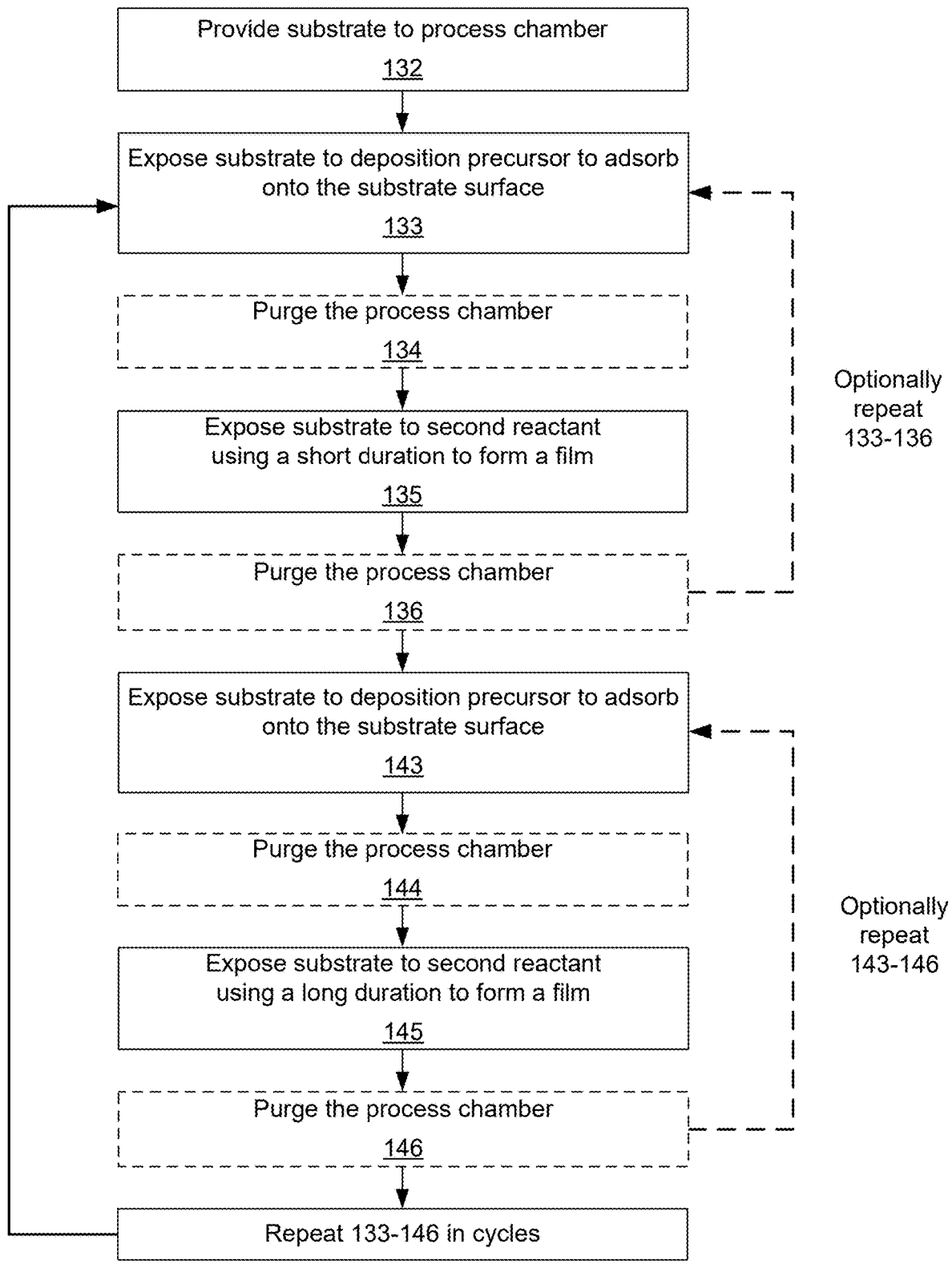
FIGS. 1A and 1B are process flow diagrams depicting operations of methods performed in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor processing is performed on a variety of substrates, including patterned substrates having high aspect ratio topography. Some processing operations involve deposition of films, which can pose various challenges. For example, as technology advances, techniques for depositing high quality films over complex topography becomes challenging. One particular technique for depositing high quality films on such topography is using conformal deposition, such as atomic layer deposition (ALD). ALD can be used to deposit different types of materials, including dielectric, metal, and other films. One particular example film that may be deposited by ALD is silicon oxide.

While silicon oxide is described herein as a particular type of film that may be deposited by ALD, it will be understood that other types of materials may also be deposited using ALD and silicon oxide is only provided as an example.

ALD is a technique that deposits thin layers of material using sequential self-limiting reactions. ALD processes use surface-mediated deposition reactions to deposit films on a layer-by-layer basis in cycles. As an example, an ALD cycle may include the following operations: (i) delivery/adsorption of a precursor (also referred to as "dose"), (ii) purging of the precursor from the chamber, (iii) delivery of a second reactant and optional plasma generation (also referred to as "conversion"), and (iv) purging of byproducts from the chamber. Purging may be optional in some cases. Additionally, dose may not necessarily be performed before conversion; in some cases, delivery of the second reactant may be performed before delivering the precursor. For purposes of discussion herein, an ALD cycle will refer to dose, purging, conversion, and purging, but it will be understood that other variations may also be utilized.

Where plasma is used during delivery of the second reactant, the process may be referred to as plasma-enhanced atomic layer deposition (PEALD). The reaction between the second reactant and the adsorbed precursor to form a film on the surface of a substrate affects the film composition and properties, such as stress, wet etch rate, dry etch rate, electrical properties (e.g., dielectric constant, breakdown voltage and leakage current), incorporation of impurities, etc. Additionally, nonuniformity of the deposited film may also be determined and in some cases, reduced nonuniformity may be desired.

In one particular example of an ALD process, a substrate surface that includes a population of surface active sites is exposed to a gas phase distribution of a first precursor, such as a silicon-containing precursor, in a dose provided to a chamber housing the substrate. Molecules of this first precursor including chemisorbed species and/or physisorbed molecules of the first precursor, are adsorbed onto the substrate surface. It will be understood that when a compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber may then be evacuated to remove most or all of first precursor remaining in gas phase so that mostly or only the adsorbed species remain. For example, the chamber may be evacuated such that the partial pressure of the first precursor in gas phase is sufficiently low to mitigate a reaction. In some implementations, the chamber may not be fully evacuated. A second reactant, such as an oxygen-containing gas, is introduced to the chamber so that some of these second reactant molecules react with the adsorbed first precursor on the surface of the substrate. In some processes, the second reactant reacts immediately with the adsorbed first precursor. In some embodiments, the second reactant reacts only after a source of activation such as plasma is applied. Such plasma exposure may be applied temporally. The chamber may then be evacuated again to remove unbound second reactant molecules. As described above, in some embodiments, the chamber may not be completely evacuated. Exposures described above may be part of a temporal ALD process whereby a substrate is exposed to each exposure in temporally separated exposures. Additional ALD cycles may be used to build film thickness.

Embodiments herein may also be relevant to spatial ALD processes. In spatial ALD, gases used for each exposure are continuously flowed in spatially different locations or "zones" in a process chamber. Each zone includes a point of injection of gases—for example, one zone may include the first precursor, one zone may include first purge gases, one zone may include second reactant, and a fourth zone may include a second purge gas. The substrate is rotated between zones to expose the substrate surface to different exposures to implement the surface reactions described above with respect to temporal ALD. That is, instead of temporally separating the exposures, exposures are separated by location.

In some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," which is herein incorporated by reference in its entirety. Plasma activation may be performed by generating the plasma in situ, or in the chamber, to generate reactive species in the chamber where the substrate is housed and contacting the substrate surface of adsorbed precursors with the reactive species. In some cases, plasma activation may be performed by generating a plasma in a remote region or generator, and reactive species from the plasma may then be delivered to the chamber housing the substrate to thereby contact the surface of adsorbed precursors with the reactive species. In various embodiments, a plasma generator that may be suitable for PEALD is a capacitively coupled plasma generator.

In various embodiments, a plasma generator that may be suitable for PEALD is an inductively coupled plasma generator. While some ALD and PEALD embodiments are described herein, it will be understood that various disclosed embodiments may be applicable to either ALD or PEALD processes.

While ALD may be used to conformally deposit a thin film into high aspect ratio features, some ALD processes may result in reduced throughput due to the duration of each ALD cycle. Thus, some processes may be too costly to implement in high volume manufacturing.

Film densification occurs in the conversion operation. Since ALD is a layer-by-layer growth process, each half reaction (adsorption and conversion) can be modulated to achieve desired film quality and throughput. However, there is a tradeoff between throughput and desired film property for certain ALD processes; while longer conversion time can result in higher quality films, longer conversion time prolongs the overall ALD cycle time, thereby reducing throughput. Likewise, while throughput can be improved by reducing conversion time of an ALD cycle, shorter conversion time results in lower quality films.

Certain techniques may be used to increase throughput during processing of a high volume of semiconductor films but some techniques have drawbacks. For example, one technique is to reduce the cycle time, or the time used in every ALD cycle, to increase throughput. Existing techniques for increasing throughput modify dose, purge, or conversion operations of every ALD cycle; however, shortening of these operations in every cycle may be limited by saturation of the deposition reactants and may result in poor film quality, defect problems and/or underfilling, and presence of voids in high aspect ratio structures in gapfill applications. As a result, some existing techniques are unable to achieve formation of high quality films with high throughput.

Provided herein are techniques of depositing high quality films with high throughput by reducing total cycle time using a long conversion time in some ALD cycles while using a short conversion time in other ALD cycles. The short conversion times reduce the average cycle time used to deposit the films, by the long conversion time results in the deposited film having certain desirable properties. That is, N cycles of an ALD cycle having short conversion time are performed with M cycles of the same ALD cycle except with a long conversion time without sacrificing film quality or defect performance. In general, in various embodiments, M is less than N.

It will be understood that the term "conversion time" used herein is used to refer to duration during exposure of an adsorbed precursor to a second reactant to convert the adsorbed precursor to a film material such as silicon oxide. Long and short conversion times are relative terms used herein to refer to conversion duration. For PEALD embodiments, long and short conversion times are conversions performed at the same plasma power—that is, a process with N cycles of short ALD conversion time cycles and M cycles of long ALD conversion time cycles are performed using the same plasma power during conversion—only the duration of plasma exposure is modulated between the N cycles and the M cycles. These are examples for binary cycles involving two separate exposures of deposition reactants but it will be understood that certain disclosed embodiments can be performed with other types of cycles including ternary cycles and quaternary cycles.

In various embodiments, a long conversion time is about 1.5 times to about 15 times longer than a short conversion time. In various embodiments, a long conversion time is about 1.5 times to about 10 times longer than a short conversion time. In various embodiments, a long conversion time is about 1.5 times to about 5 times longer than a short conversion time. In various embodiments, a long conversion time is about 1.5 times longer than a short conversion time.

In some embodiments, a single long conversion time ALD cycle can be used for every 1 to 20 or more short conversion time ALD cycles. In some embodiments, the number of short conversion time ALD cycles that may be used for every one long conversion time ALD cycle depends on the thickness of the film deposited by the short conversion time ALD cycle and the duration used for the short and long conversion times—that is, the number of cycles of short conversion time ALD cycles that are performed for every one long conversion time ALD cycle is defined by the maximum thickness of film deposited by short conversion time ALD cycles that can be densified by one long conversion time ALD cycle.

In some embodiments, at particular long conversion times or higher, the process may have a reduced advantage; that is, while the film quality may also be improved as compared to performing only short conversion time ALD cycles, using extremely long conversion time ALD cycles may exhibit less reduction of process time while achieving higher quality films compared to short conversion time ALD cycle film quality.

In some embodiments, for blanket films, there can be a saturation point in which at a particular conversion duration or higher, no modulation of wet etch rate is observed. In some cases, this saturation point is at 0.75 second for a four-station chamber system with 13.56 MHz RF generator, based on particular process conditions.

Certain disclosed embodiments may be performed in thermal, spatial, or plasma-enhanced ALD processes. In some embodiments, conversion time is modulated while maintaining the same plasma power during conversion of all ALD cycles. In some embodiments, conversion time is modulated as well as plasma power and other process conditions to achieve a desired film property.

Certain disclosed embodiments can be used to deposit a variety of films, including, but not limited to, silicon oxide, silicon nitride, metal oxides, metal nitrides, metal carbides, other oxides, nitrides, carbides, oxynitrides, oxycarbides, and the like.

Modulating conversion time can be used to achieve various types of desired film properties. Film quality can be determined using different metrics. For silicon oxide films, one example metric for film quality is wet etch rate which may be evaluated by dipping a substrate in diluted hydrofluoric acid, for example, a 200:1 bath for 180 seconds. Increased conversion time allows sufficient time for a surface reaction to take place, produces a desired reaction product, and densifies the deposited film. Consequently, wet etch rate of the deposited film decreases. The effect of having even one longer conversion ALD cycle for every couple of short conversion ALD cycles significantly improved throughput, and surprisingly achieved better film quality. In fact, using a longer conversion time that is only 1.1 times longer than the short conversion time resulted in a surprising result of increased film quality while significantly reducing cycle time.

Other metrics for film quality on the sidewall of a high aspect ratio structure (which may be different from film quality on a silicon blanket wafer or field region) are sidewall thickness (step coverage) or sidewall wet etch rate. Step coverage may be calculated by comparing the average thickness of a deposited film on a bottom, or different location of the sidewall, of a trench to the average thickness of a deposited film on the top of a feature or trench.

One example of step coverage may be calculated by dividing the average thickness of the deposited film on the sidewall by the average thickness of the deposited film at the top of the feature and multiplying the quotient by 100 to obtain a percentage. The closer the percentage is to 100%, the more densified the film is inside a feature. The step coverage and uniformity of film property along the sidewall depends on, among many factors, the transport of the deposition precursor, reactant ions and/or radicals (such as those generated by igniting a reactant gas with a plasma), and by-products. As conversion time of an ALD process increases, step coverage improves and approaches 100%. In some cases, sidewall step coverage may be a useful metric of film quality, but in some cases, a different method may be used to detect changes in film quality or density. One such method involves evaluating sidewall wet etch rate, which can be determined by dipping a small sample of or a patterned wafer into a diluted acid bath and measuring the etched amount. The smaller the etched amount for a given dip time, the better the sidewall film quality is.

Certain disclosed embodiments described herein reduce total process time and increase throughput for depositing silicon oxide films on several substrates in a batch process. A batch process may be referred to herein as processing multiple substrates sequentially in a process chamber, which may include one or more stations, each station used for processing a wafer for various purposes such that single wafers are transferred into and out of each chamber and cycled between stations in some embodiments. Some disclosed embodiments are suitable for depositing thick silicon oxide films by PEALD using a mixture of oxygen and argon during plasma conversion without sacrificing film quality. Some disclosed embodiments are suitable for depositing thick silicon oxide films by PEALD using a mixture of nitrous oxide, oxygen, and argon during plasma conversion without sacrificing film quality.

For silicon oxide films deposited using certain disclosed embodiments, without being bound by a particular theory, it is believed that silicon oxide films deposited using short conversion time results in lower quality films because of insufficient time to rearrange bonds in each layer of deposited silicon oxide formed during a conversion operation to convert adsorbed silicon precursor to silicon oxide. In contrast, films have higher quality when deposited using longer conversion time because it allows sufficient time for surface reaction to take place to produce the desired ALD reaction product. For example, one particular improvement may be a reduced wet etch rate in 200:1 hydrofluoric acid, such that the higher quality films can withstand harsher wet etch rate conditions without being etched.

For PEALD embodiments, plasma conversion time may be modulated from cycle to cycle. Plasma generates reactive species, properties of which can be a function of time; thus, increased plasma conversion time can generate sufficient reactive species to penetrate layers of material deposited and rearrange bonds or modify properties of the deposited material to modulate properties of the deposited film. In some embodiments, properties of the reactive species may be correlated to ion penetration depth in blanket films. In some embodiments, properties of reactive species can correlate with plasma energy; that is, higher plasma energy may result in reactive species having increased plasma density, for example. In some embodiments, the same plasma power is used during long and short durations but due to the difference in duration, reactive species may behave differently.

In both thermal and plasma-enhanced ALD processes, for deposition into high aspect ratio features, a longer duration can result in increased diffusion into high aspect ratio features, thereby depositing higher quality films deeper into features.

A "supercycle" is described herein as including one or more long conversion time ALD cycles and one or more short conversion ALD cycles. A supercycle may be repeated multiple times to deposit a desired film.

Conversion duration modulation can be used to modify a desired quality of the film. One example of conversion duration modulation is switching between short and long conversion durations from ALD cycle to ALD cycle. Long conversion duration ALD cycles may be performed between each short duration ALD cycle, or may be performed every n cycles of short duration ALD cycles. Another example of conversion duration modulation is using multiple conversion durations of ALD cycles in a supercycle, and repeating the supercycle. For example, in some embodiments, a "gradient" process may be used, the gradient referring to varying degrees of conversion durations used from cycle to cycle. In such an example, a supercycle includes three or more ALD cycles, and each cycle includes a first, second, and third duration, each of increasing amount as compared to its prior cycle. For example, a supercycle may include a first conversion time ALD cycle, followed by a second, longer conversion time ALD cycle (such as an ALD cycle with a conversion time being 1.5 times the first conversion time), followed by a third, even longer conversion time ALD cycle (such as an ALD cycle with a conversion time being 1.5 times the second conversion time). Variations of conversion times may be used in various embodiments depending on the desired film quality and the process cycle time tolerance. Further implementations are described in detail below with respect to the figures.

FIG. 1A is a process flow diagram depicting operations performed in accordance with certain disclosed embodiments. Operations in FIG. 1A may be performed in a process chamber having one or more stations. In various embodiments, the process chamber has four stations. Suitable tools are further described below in the Apparatus section.

Operations in FIG. 1A may be performed at a chamber pressure between 1 mTorr and about 10 Torr, or between 1 mTorr and 500 mTorr, or between about 1 Torr and about 10 Torr. Operations in FIG. 1A may be performed at a substrate temperature between about −50° C. to about 900° C., or between about 100° C. and about 400° C., or between about 200° C. and about 300° C., or between about 400° C. and 550° C., or between about 400° C., and about 600° C., or between about 400° C., and about 700° C., or between about 400° C., and about 800° C. It will be understood that a substrate temperature is defined as the temperature for which a pedestal holding a substrate is set at to thereby heat the substrate to the desired temperature.

In operation 132, a substrate is provided to the process chamber. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Non-limiting examples of under-layers include dielectric layers and conducting layers, e.g., silicon oxides, silicon nitrides, silicon carbides, metal oxides, metal nitrides, metal carbides, and metal layers.

The substrate may be patterned in various embodiments. The pattern may include topography, which may include vias, holes, and trenches. Such features may have high aspect ratios. For example, the aspect ratio of features may be between at least about 5:1, or at least about 10:1, or at least about 15:1, or at least about 170:1, or between about 10:1 and about 300:1, for example about 180:1. The feature openings of features may range between about 10 nm and about 10 µm, or between about 100 nm and about 10 µm, or less than about 10 nm in various embodiments.

In operation 133, the substrate is exposed to a precursor for a duration sufficient to adsorb the precursor onto a surface of the substrate to form an adsorbed layer of the precursor.

The duration sufficient to adsorb the precursor depends on the precursor used and partial pressure of the precursor. Other process conditions that may be relevant to the duration sufficient to adsorb the precursor include, but are not limited to, substrate temperature, chamber pressure, presence of other gases in chamber, precursor flow rate, precursor selected, surface chemistry of substrate, and surface topography of substrate.

In some embodiments, certain disclosed embodiments may involve alternating short and long durations in ALD cycles of any of the non-limiting operations: dose, purge, pressure, RF power and/or RF energy. In certain disclosed embodiments, alternating between short and long conversion durations may be performed in combination with, or without modulating other operations of the ALD cycle to reduce the total cycle time and improve throughput while obtaining a desired film property, such as properties consistent with films deposited using only long conversion times.

In various embodiments, the precursor may be delivered to the process chamber housing the substrate using a carrier gas, which may be an inert gas such as argon. In some embodiments, the carrier gas is diverted prior to flow into the chamber.

In operation 134, the process chamber is optionally purged. A process chamber housing the substrate may be purged to remove precursors that are not adsorbed onto the substrate surface. Purging the chamber may involve flowing a purge gas or a sweep gas, which may be a carrier gas used in other operations or may be a different gas. Example purge gases include argon, nitrogen, hydrogen, and helium. In various embodiments, the purge gas is an inert gas. Example inert gases include argon, nitrogen, and helium. In some embodiments, purging may involve evacuating the chamber. In some embodiments, the purge gas is the same as a carrier gas used to deliver the precursor to the chamber. In some embodiments, operation 104 may include one or more evacuation subphases for evacuating the process chamber. Alternatively, it will be appreciated that operation 104 may be omitted in some embodiments. Operation 104 may have any suitable duration, such as between about 0.1 seconds and about 2 seconds.

In operation 135, the substrate is exposed to a second reactant using a short conversion time to convert adsorbed precursor to a film. In some embodiments, a plasma is optionally generated during operation 135. In various embodiments, a short conversion time is between about 0.05 seconds and about 0.3 seconds.

In cases of PEALD, reactive species is provided to activate the second reactant, such as an oxygen-containing gas or oxidant, into ions and radicals and other activated species, which react with the adsorbed layer of the first precursor. For example, the plasma may directly or indirectly activate the oxygen-containing gas phase molecules to form oxygen radicals or ions.

Reactive species may have a particular plasma energy, which may be determined by the duration for which radio frequency plasma is turned on (RF time) and the radio frequency plasma power (RF power). Plasma power may be between about 500 W and about 6500 W for a 4-station tool; that is, the plasma power per substrate may be between about 125 W and about 1625 W.

In operation 135, the substrate is exposed to a particular plasma power for a short duration. The plasma power can depend on the limitations of the tool and the risk of sputtering.

In one example, with 13.56 MHz generator, stable plasma energy as low as 300 J is produced by applying 2000 W for 0.15 seconds. RF time for low energy plasma depends on the RF generator and also RF power used, so the range varies based on those parameters.

The amount of reactive species present in the chamber during deposition may also be modulated by changing the plasma power or plasma time. However it will be understood that in various embodiments described herein where PEALD cycles are modulated from one cycle to another cycle, the amount of reactive species may be modulated by changing only the RF time while keeping the same maximum RF power allowable by the RF generator to maximize throughput.

In various embodiments, the plasma is an in-situ plasma, such that the plasma is formed directly above the substrate surface in the chamber. Plasmas for ALD processes may be generated by applying a radio frequency (RF) field to a gas using two capacitively coupled plates. The plasma generates reactive species. Reactive species may include electrons, ions, radicals, and neutral species. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. In various embodiments, a high frequency plasma is used having a frequency of at least about 13.56 MHz, or at least about 27 MHz, or at least about 40 MHz, or at least about 60 MHz. In some embodiments, a microwave-based plasma may be used. Non-limiting examples of electrodes include process gas distribution showerheads and substrate support pedestals. In various embodiments, the pedestal is a powered pedestal and the chamber includes a grounded showerhead. In some embodiments, the pedestal is grounded and the showerhead is powered. It will be appreciated that plasmas for ALD processes may be formed by one or more suitable methods other than capacitive coupling of an RF field to a gas. In some embodiments, the plasma is a remote plasma, such that a second reactant is ignited in a remote plasma generator upstream of the chamber, then delivered to the chamber where the substrate is housed.

In some embodiments, plasma is not used and thermal ALD is performed instead such that duration of exposure to the second reactant during conversion is modulated from cycle to cycle.

In some embodiments, operation 135 may be performed by modulating the process chamber in lieu of or in addition to conversion time. That is, in some embodiments, a low pressure is used during operation 135 while a higher pressure is used during operation 145 further described below. A low pressure used during operation 135 may be a process chamber pressure between about 1 Torr and about 5 Torr. In some embodiments, pressure may be in the millitorr range depending on the tool used. For example, in some embodiments, an ICP plasma process chamber may be set to a chamber pressure of about 1 mTorr.

In operation 136, the process chamber is again optionally purged to remove any excess byproducts from the reaction between the precursor and the second reactant. The process conditions for operation 106 may be any of those described above with respect to operation 104. In some embodiments, the chamber is purged using an inert gas flowed at a flow rate between about 5 slm and about 70 slm.

Operations 133 to 136 may be optionally repeated multiple times, each time constituting one cycle of short conversion ALD. A desired film property, such as reduced wet etch rate, is achieved following operations 133-136 as further described below.

After one or more cycles of repeating operations 133-136, operations 143-146 may be performed. It will be understood that while operations 133-136 are depicted as occurring before operations 143-146 in FIG. 1, one of skill in the art will understand that operations 143-146 may also be performed prior to operations 133-136 and that any combination of operations 133-136 and 143-146 may be performed in any order.

In operation 143, the substrate is exposed to a precursor to adsorb the precursor onto the substrate surface. This operation may be the same as operation 133 described above. In operation 144, the process chamber is optionally purged. This operation may be the same as operation 134 as described above. In operation 145, the substrate is exposed to the second reactant for a duration longer than that of operation 135.

Without being bound by a particular theory, for PEALD embodiments, it is believed that the long conversion operation results in reactive species (for example ions or radicals) which provides energy beneficial in stabilizing bonds or increasing cross-linking in a substantial depth of the film already deposited, thereby improving the film quality on the surface. In case when ions are the reactive species, the depth of ion penetration depends on the size of the ion—that is, heavier ions may be capable of penetrating a greater depth.

How frequently a long conversion time cycle is performed is determined by the quality of the film deposited of the lower quality film deposited by the short conversion time ALD cycles and the relative durations of the short and long conversion times.

For PEALD embodiments, increased RF time may be performed using the same RF power used in operation 135. In some embodiments, this may result in high plasma energy, which may range from between about 600 J to about 6000 J, or about 1500 J for four substrates. In some cases, the substrate is exposed to the reactive species for a long conversion duration of 0.3 second to 3 seconds using 2000 W RF power. In various embodiments the high plasma energy per substrate is between about 150 J and about 1500 J. High plasma energy may be limited by the RF time to ensure industrially applicable throughput, as well as the tool's limitations for RF time and RF power.

Like operation 135 above, in some embodiments, operation 145 may be performed by modulating the process chamber in lieu of or in addition to conversion time. That is, in some embodiments, a high pressure is used during operation 145 while a low pressure is used during operation 135 further described above. A high pressure used during operation 145 may be a process chamber pressure between about 10 Torr and about 15 Torr. Without being bound by a particular theory, it is believed that a higher pressure increases density of radicals but reduces ion energy. Thus, alternating between low pressure and high pressure ALD cycles, or PEALD cycles, can result in a film having a particular desired property, such as reduced wet etch rate. The frequency of performing the high pressure ALD cycle in a series of low pressure ALD cycles depends on the number of layers used for the higher and lower pressure conditions. In one particular example, a high pressure ALD cycle may be performed for every 1 to 20 low pressure ALD cycles.

In operation 146, the process chamber is again optionally purged which may use the same process conditions and/or chemistry as described above with respect to operation 134.

Operations 143-146 may be repeated in multiple cycles of long conversion time ALD. The number of long conversion time cycles (M number of cycles) used for every N cycles of short conversion time ALD may depend on how many cycles of short conversion time ALD were used where N is any integer greater than or equal to 1. Additionally, the conversion duration used in each of the repeated cycles of long conversion time ALD may vary from cycle to cycle. For example, a supercycle may include N number of short conversion ALD cycles, followed by one long conversion ALD cycle that is 1.1 times the duration of the short conversion, followed by N number of short conversion ALD cycles, further followed by one long conversion ALD cycle that is 5 times the duration of the short conversion, etc.

Figure 1B:
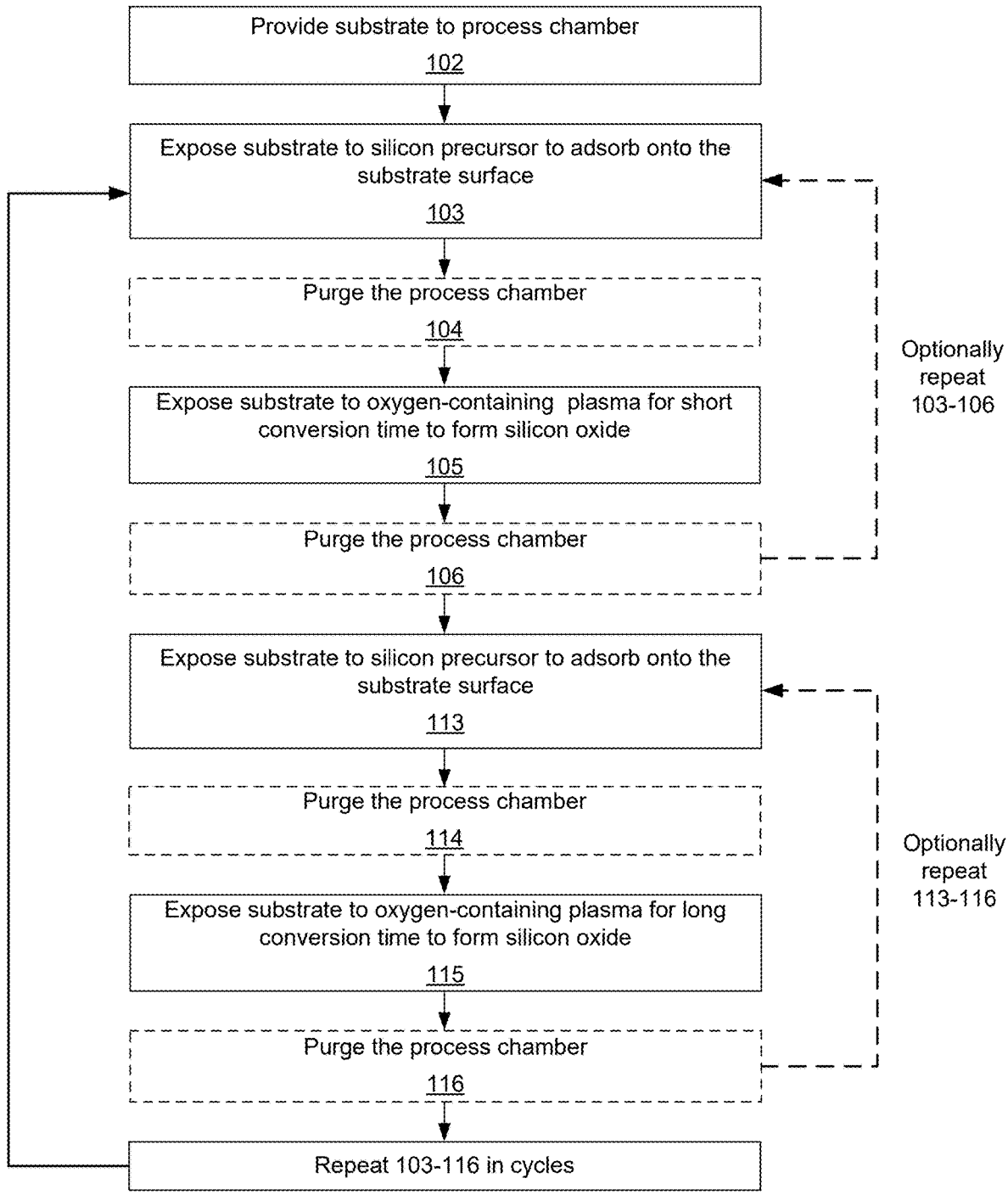

FIG. 1B is a process flow diagram depicting example operations performed for depositing silicon oxide by alternating conversion time PEALD in accordance with certain disclosed embodiments. Operations in FIG. 1B may be performed in a process chamber having one or more stations. In various embodiments, the process chamber has four stations. Suitable tools are further described below in the Apparatus section.

Operations in FIG. 1B may be performed at a chamber pressure between about 1 Torr and about 10 Torr. Operations in FIG. 1B may be performed at a substrate temperature between about −50° C. to about 900° C., or between about 100° C. and about 400° C., or between about 200° C. and about 300° C.

In operation 102, a substrate is provided to the process chamber. The substrate may be any of those described above with respect to Figure TA.

In operation 103, the substrate is exposed to a silicon-containing precursor for a duration sufficient to adsorb the precursor onto a surface of the substrate to form an adsorbed layer of the precursor.

Silicon-containing precursors suitable for use in accordance with disclosed embodiments include polysilanes ($H_3Si$—$(SiH_2)_n$—$SiH_3$), where n≥0. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes, and fluorosilanes. Although halosilanes, particularly fluorosilanes, may form reactive halide species that can etch silicon materials when a plasma is struck, a halosilane may not be introduced to the chamber when a plasma is struck in some embodiments, so formation of a reactive halide species from a halosilane may be mitigated. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tert-butylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$).

In various embodiments, the silicon precursor is di-isopropylaminosilane (DIPAS).

In operation 104, the process chamber is optionally purged. Purging may be performed using any of the chemistries and process conditions described above with respect to operation 134 of FIG. 1A.

In operation 105, the substrate is exposed to an oxygen-containing plasma with an inert gas at a short conversion time to convert adsorbed silicon precursor to silicon oxide. The specific conversion time used for a short conversion depends on the type of film being deposited, the chemistries used, and the process conditions such as temperature and pressure. A short conversion time may be between about 0.05 seconds and about 0.3 seconds in some embodiments.

The oxygen-containing plasma may be generated by introducing an oxidant and igniting a plasma. The plasma may be generated in situ or in a remote generator. Reactive species may be delivered in the oxygen-containing plasma to the substrate surface to react with silicon-containing precursor adsorbed onto the substrate surface to thereby form silicon oxide. Example oxidants include oxygen gas, water, carbon dioxide, nitrous oxide, hydrogen peroxide, and combinations thereof. In various embodiments, the substrate is exposed to an oxidant and an inert gas simultaneously while the plasma is ignited. For example, in one embodiment, a mixture of oxygen and argon is introduced to the substrate while the plasma is ignited.

For certain PEALD embodiments, low plasma energy used in operation 105 may be between about 200 J and about 500 J or about 300 J in some embodiments.

In operation 106, the process chamber is again optionally purged to remove any excess byproducts from the reaction between the silicon precursor and the oxygen-containing plasma. Process conditions and chemistry used during purging can be any of those described above with respect to operation 134 of FIG. 1A.

Operations 103 to 106 may be optionally repeated multiple times, each time constituting one cycle of short conversion PEALD. Such layers may result in lesser quality silicon oxide films, including layers that may be less densified, and thus this film alone may have a high wet etch rate. However, these short conversion PEALD cycles have short cycle time and increase throughput.

After one or more cycles of repeating operations 103-106, operations 113-116 may be performed. It will be understood that while operations 103-106 are depicted as occurring before operations 113-116 in FIG. 1, one of skill in the art will understand that operations 113-116 may also be performed prior to operations 103-106 and that any combination of performing operations 103-106 and operations 113-116 may be performed in any order.

In operation 113, the substrate is exposed to a precursor to adsorb the precursor onto the substrate surface. This operation may be the same as operation 103 described above. In operation 114, the process chamber is optionally purged. This operation may be the same as operation 104 as described above. In operation 115, the substrate is exposed to an oxygen-containing plasma with an inert gas for a long conversion duration to convert adsorbed silicon precursor to silicon oxide while increasing overall quality of the silicon oxide film. In some embodiments, plasma energy of 1500 J is used to penetrate 10 layers of silicon oxide deposited using about 10 cycles of low plasma energy PEALD at 300 J such that one cycle of 1500 J PEALD is performed for every 10 cycles of 300 J PEALD to result in a film having wet etch rate qualities similar to that of a film deposited using only 1500 J PEALD cycles.

High plasma energy may range from between about 600 J to about 6000 J, or about 1500 J for four substrates. This translates to RF time range of 0.3 second to 3 seconds for a 2000 W RF power. In various embodiments the high plasma energy per substrate is between about 150 J and about 1500 J.

In some cases, a long conversion duration is used such that the conversion duration is about 1.1 times to about 15 times longer than the short conversion duration.

In operation 116, the process chamber is again optionally purged which may use the same process conditions and/or chemistry as described above with respect to operation 104.

Operations 113-116 may be repeated in multiple cycles of long conversion step ALD. The number M of long conversion time cycles used and the frequency of performing the long conversion time cycles may depend on how many cycles of short conversion ALD were used where M is any integer greater than or equal to 1. Additionally, the conversion duration used in each of the repeated cycles of long conversion ALD may vary from cycle to cycle.

Figure 2:
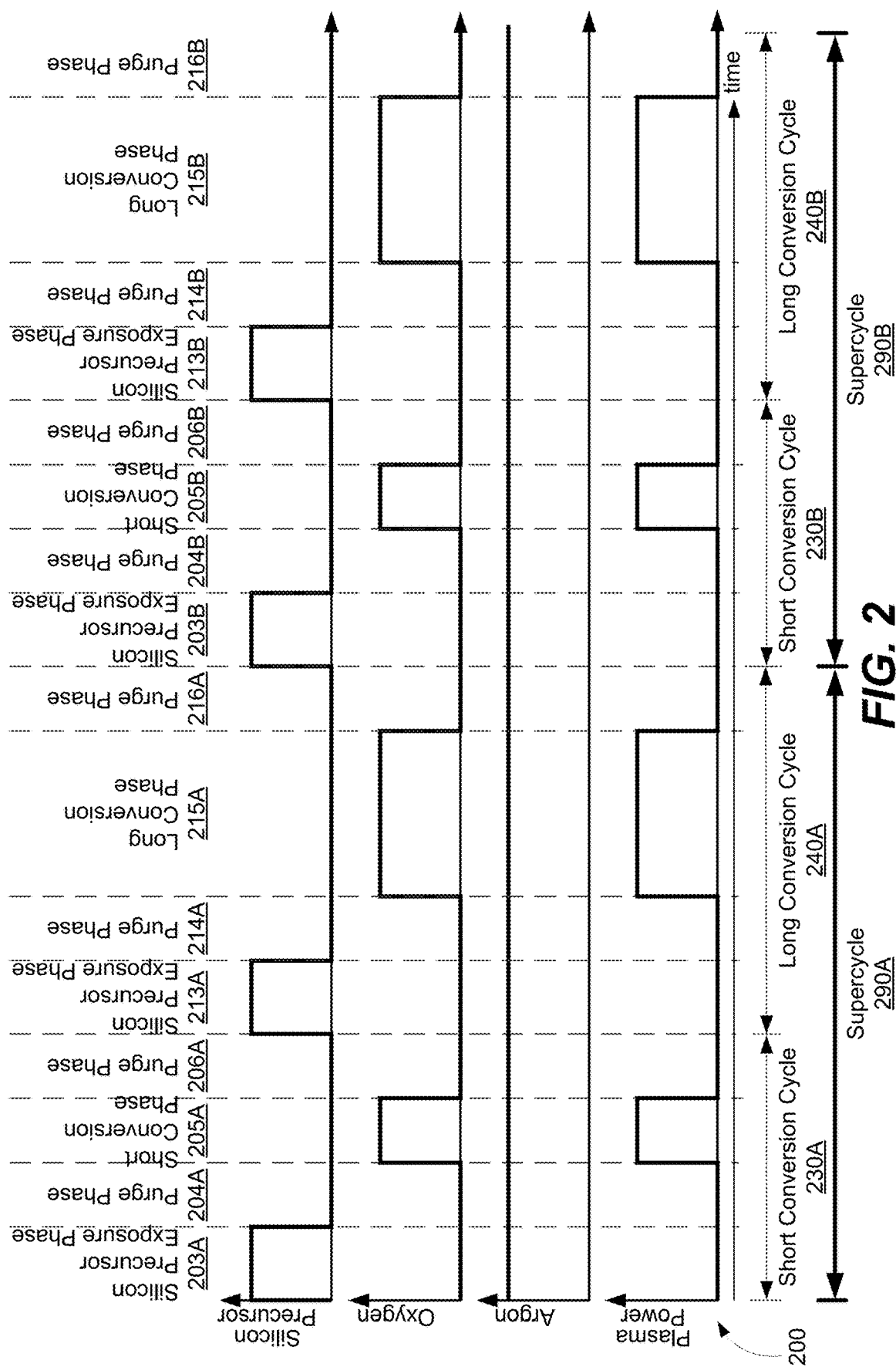
FIG. 2 is a timing sequence diagram showing an example of cycles in a method in accordance with certain disclosed embodiments.

FIG. 2 shows a timing sequence diagram showing an example of a process 200 having two supercycles 290A and 290B in a method in accordance with certain disclosed embodiments. Supercycle 290A includes one short conversion cycle 230A and one long conversion cycle 240A, while supercycle 290B includes one short conversion cycle 230B and one long conversion cycle 240B. In this example, the supercycle having one short conversion cycle and one long conversion cycle is repeated. However, it will be understood to one of skill in the art that more than one short conversion or long conversion cycle may be used in a single supercycle, and further that more than one type of conversion duration cycle can be used (such as one or more short conversion cycles and one or more mid-conversion time cycles and one or more long conversion cycles, as one particular non-limiting example).

In this particular example of PEALD, short conversion cycle 230A includes four phases-silicon precursor exposure phase 203A, purge phase 204A, short conversion phase 205A, and purge phase 206A. During silicon precursor exposure phase 203A, silicon precursor flow is turned on, argon flow is turned on as a carrier gas, oxygen flow is turned off, and plasma power is 0W. Silicon precursor exposure phase 203A may correspond to operation 103 of FIG. 1B.

During purge phase 204A, silicon precursor flow is turned off, argon flow continues to flow to purge the chamber, oxygen flow remains off, and plasma power remains 0W. Purge phase 204A may correspond to operation 104 of FIG. 1B.

During short conversion phase 205A, silicon precursor flow remains off, oxygen flow is turned on, argon flow remains on, and plasma power is turned on to a particular plasma power. Short conversion phase 205A may correspond to operation 105 of FIG. 1B.

During purge phase 206A, silicon precursor flow remains off, argon flow continues to flow to purge the chamber, oxygen flow is turned off, and plasma power is 0W. Purge phase 206A may correspond to operation 106 of FIG. 1B.

Long conversion cycle 240A includes four phases—silicon precursor exposure phase 213A, purge phase 214A, long conversion plasma phase 215A, and purge phase 216A. During silicon precursor exposure phase 213A, silicon precursor flow is turned on, argon flow is turned on as a carrier gas, oxygen flow is turned off, and plasma power is 0W. Silicon precursor exposure phase 213A may correspond to operation 113 of FIG. 1B.

During purge phase 214A, silicon precursor flow is turned off, argon flow continues to flow to purge the chamber, oxygen flow remains off, and plasma power remains 0W. Purge phase 214A may correspond to operation 114 of FIG. 1B.

During long conversion plasma phase 215A, silicon precursor flow remains off, oxygen flow is turned on, argon flow remains on, and plasma power is turned on to a particular plasma power which in this example is the same as the plasma power of short conversion phase 205A, but the time that the plasma is on is longer to correspond to longer conversion plasma. Long conversion plasma phase 215A may correspond to operation 115 of FIG. 1B.

During purge phase 216A, silicon precursor flow remains off, argon flow continues to flow to purge the chamber, oxygen flow is turned off, and plasma power is 0W. Purge phase 216A may correspond to operation 116 of FIG. 1B.

Short conversion cycle 230A and long conversion cycle 240A are repeated in a second supercycle 290B, which includes short conversion cycle 230B and long conversion cycle 240B.

Short conversion cycle 230B includes four phases—silicon precursor exposure phase 203B, purge phase 204B, short conversion plasma phase 205B, and purge phase 206B. During silicon precursor exposure phase 203B, silicon precursor flow is turned on, argon flow is turned on as a carrier gas, oxygen flow is turned off, and plasma power is 0W. Silicon precursor exposure phase 203B may correspond to operation 103 performed in repeating operations 103-116 of FIG. 1B.

During purge phase 204B, silicon precursor flow is turned off, argon flow continues to flow to purge the chamber, oxygen flow remains off, and plasma power remains 0W. Purge phase 204B may correspond to operation 104 performed in repeating operations 103-116 of FIG. 1B.

During short conversion plasma phase 205B, silicon precursor flow remains off, oxygen flow is turned on, argon flow remains on, and plasma power is turned on to a particular plasma power. Short conversion plasma phase 205B may correspond to operation 105 performed in repeating operations 103-116 of FIG. 1B.

During purge phase 206B, silicon precursor flow remains off, argon flow continues to flow to purge the chamber, oxygen flow is turned off, and plasma power is 0W. Purge phase 206B may correspond to operation 106 performed in repeating operations 103-116 of FIG. 1B.

Long conversion cycle 240B includes four phases—silicon precursor exposure phase 213B, purge phase 214B, long conversion plasma phase 215B, and purge phase 216B. During silicon precursor exposure phase 213B, silicon precursor flow is turned on, argon flow is turned on as a carrier gas, oxygen flow is turned off, and plasma power is 0W.

Silicon precursor exposure phase 213B may correspond to operation 113 performed in repeating operations 103-116 of FIG. 1B.

During purge phase 214B, silicon precursor flow is turned off, argon flow continues to flow to purge the chamber, oxygen flow remains off, and plasma power remains OW. Purge phase 214B may correspond to operation 114 performed in repeating operations 103-116 of FIG. 1B.

During long conversion plasma phase 215B, silicon precursor flow remains off, oxygen flow is turned on, argon flow remains on, and plasma power is turned on to a particular plasma power which in this example is the same as the plasma power of short conversion plasma phase 205B, but the time that the plasma is on is longer to correspond to long conversion plasma.

Long conversion plasma phase 215B may correspond to operation 115 performed in repeating operations 103-116 of FIG. 1B.

During purge phase 216B, silicon precursor flow remains off, argon flow continues to flow to purge the chamber, oxygen flow is turned off, and plasma power is OW. Purge phase 216B may correspond to operation 116 performed in repeating operations 103-116 of FIG. 1B.

Figure 3B:
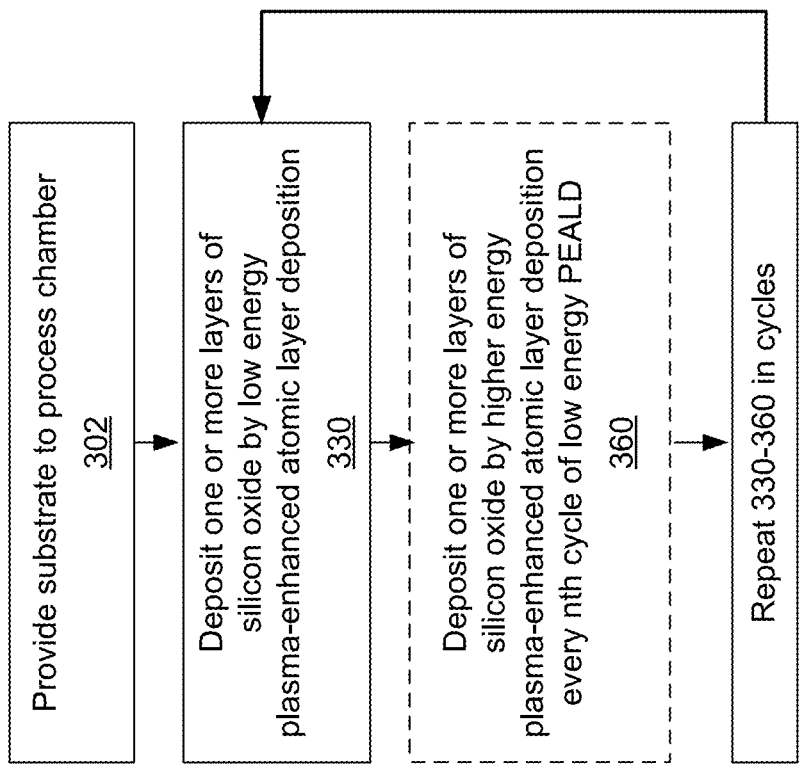
FIGS. 3A and 3B are process flow diagrams depicting operations of method in accordance with certain disclosed embodiments.
Figure 3A:
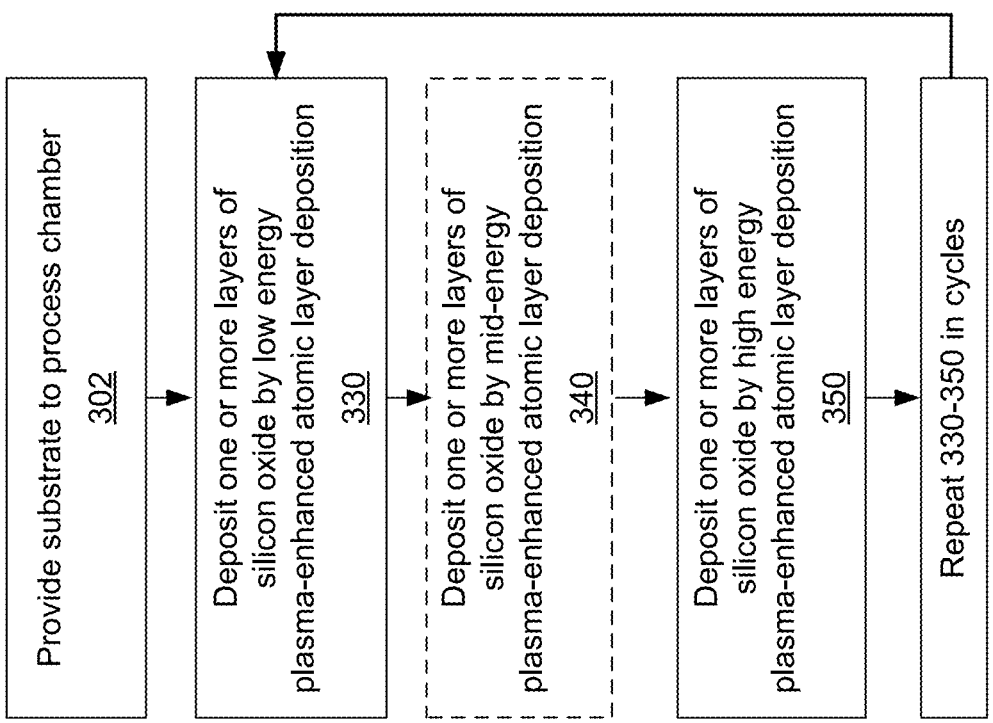

FIGS. 3A and 3B are process flow diagrams depicting operations of method in accordance with certain disclosed embodiments. FIG. 3A shows an example of a variation of certain disclosed embodiments whereby multiple layers of silicon oxide are deposited using different conversion durations during conversion to form an overall silicon oxide layer having certain desirable properties. In this particular example, a "gradient" plasma power scheme is used.

In operation 302, a substrate is provided to a process chamber. This operation may be the same as operation 102 described above with respect to FIG. 1B.

In operation 330, one or more layers of silicon oxide are deposited by short conversion PEALD, which may correspond to operations 103-106 of FIG. 1B and may use a short conversion such as about 0.15 second during conversion.

In operation 340, one or more layers of silicon oxide are optionally deposited by mid-conversion time PEALD, which may involve introduction of a silicon precursor, optional purging, introduction of oxygen and argon and igniting of a plasma for a duration of about 0.45 second for example, and optional purging.

In operation 350, one or more layers of silicon oxide are deposited by long conversion PEALD, which may correspond to operations 113-116 of FIG. 1B and may use along conversion such as about 0.75 second during conversion.

This is described herein as a "gradient" scheme because of the increasing conversion times of 0.15 second, 0.45 second, and 0.75 second as a particular example of increasing conversion time in a supercycle. Operations 330-350 may then be repeated in multiple cycles as desired.

FIG. 3B shows yet another alternative embodiment whereby along conversion PEALD cycle is performed every nth cycle of a short conversion PEALD cycle, where n is an integer greater than or equal to 1.

Operation 302 is consistent with operation 302 of FIG. 3A. Operation 330 is consistent with operation 330 of FIG. 3A. In operation 360, one or more layers of silicon oxide are deposited by long conversion PEALD for every nth cycle of short conversion PEALD. One supercycle may include both N cycles of short conversion PEALD and M cycles of long conversion PEALD such that a supercycle is repeated multiple times, where N and M are each integer greater than or equal to 1. Further, N and M can be different or same integers. Operations 330 and 360 may then be repeated in cycles.

Silicon oxide films deposited using alternating conversion time ALD techniques described herein may achieve a wet etch rate in 200:1 hydrofluoric acid for 180 seconds of less than about 1 Å/minute, or between about 0.5 and about 0.6 Å/minute.

It will be understood that while silicon oxide films are described herein, applications of certain disclosed embodiments may be applicable for depositing other silicon-containing films, including, but not limited to, silicon nitride, silicon carbide, silicon oxynitride, silicon carboxynitride, silicon oxycarbide, and poly-silicon.

Although PEALD is described herein as an example, certain disclosed embodiments can be applied to any ALD technique, including thermal and spatial ALD, and also although conversion time is described here, dose, purge, RF power and/or pressure can also be modulated.

Apparatus

Figure 4:
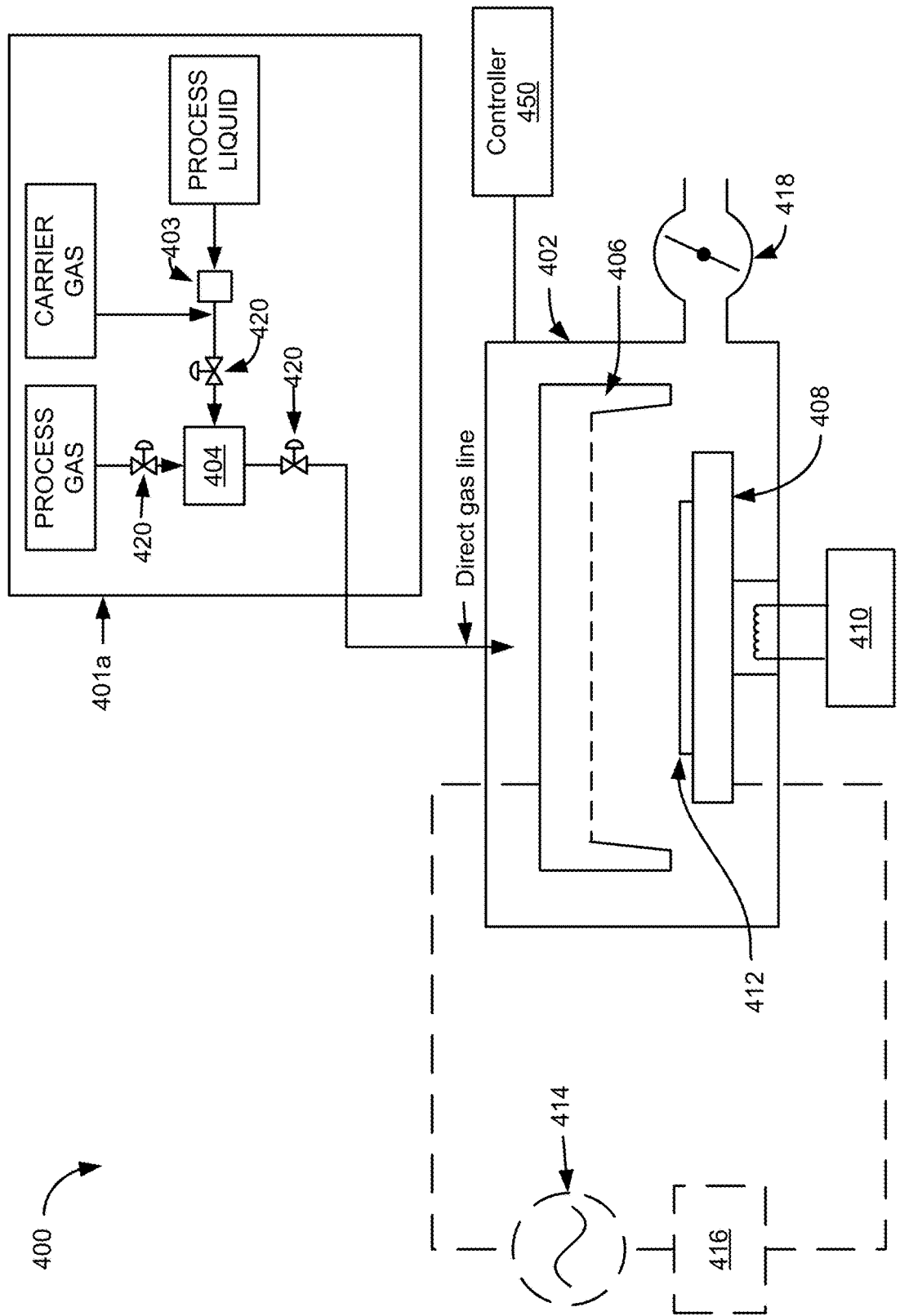
FIG. 4 is a schematic diagram of an example process chamber for performing disclosed embodiments.
Figure 5:
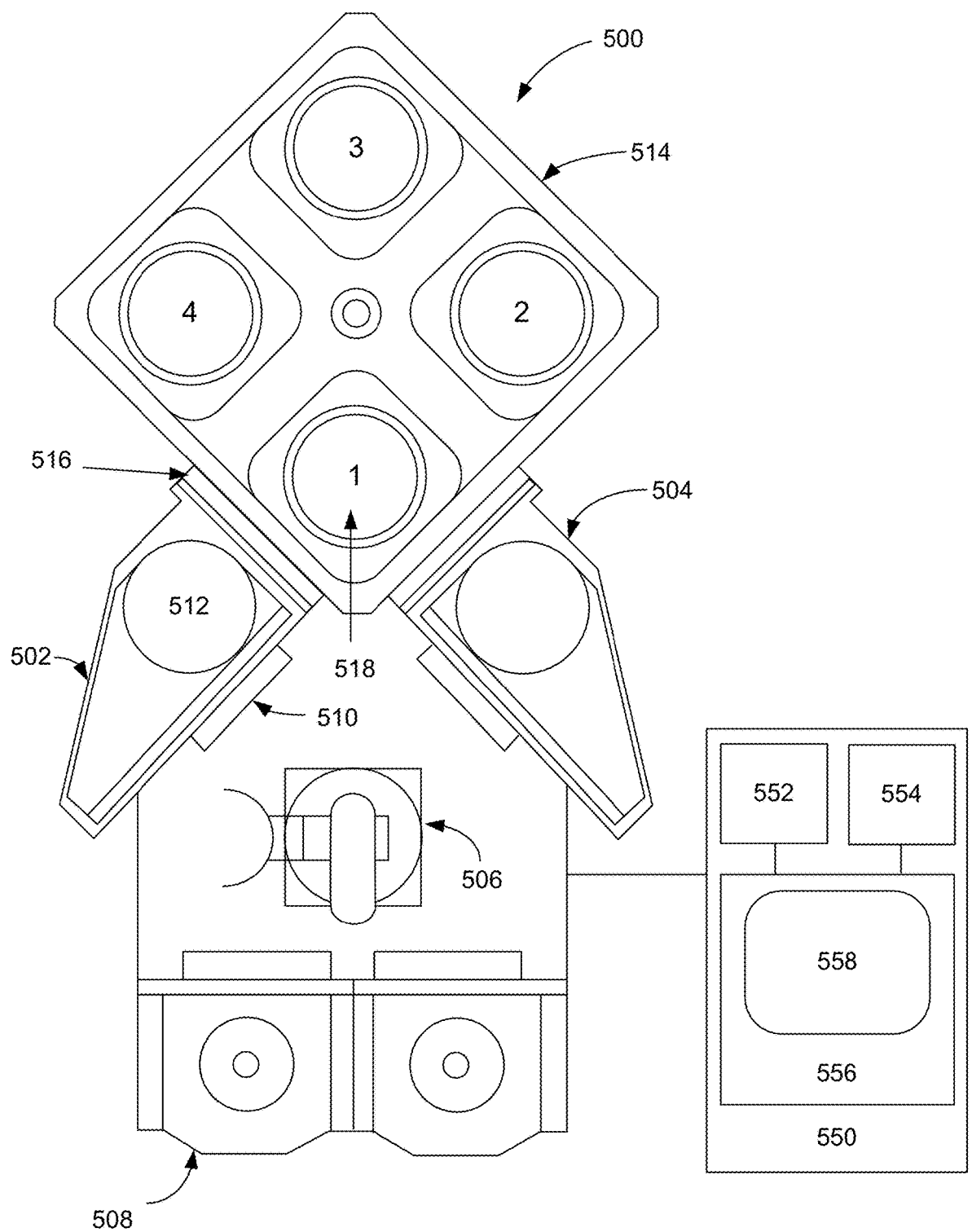
FIG. 5 is a schematic diagram of an example process tool for performing disclosed embodiments.

FIG. 4 depicts a schematic illustration of an embodiment of an atomic layer deposition (ALD) process station 400 having a process chamber body 402 for maintaining a low-pressure environment. A plurality of ALD process stations 400 may be included in a common low pressure process tool environment. For example, FIG. 5 depicts an embodiment of a multi-station processing tool 500. In some embodiments, one or more hardware parameters of ALD process station 400 including those discussed in detail below may be adjusted programmatically by one or more controllers 450.

ALD process station 400 fluidly communicates with reactant delivery system 401a for delivering process gases to a showerhead 406. Reactant delivery system 401a includes a mixing vessel 404 for blending and/or conditioning process gases, such as a silicon precursor gas, or second reactant gas (e.g., oxygen and argon), for delivery to showerhead 406. One or more mixing vessel inlet valves 420 may control introduction of process gases to mixing vessel 404. Argon plasma may also be delivered to the showerhead 406 or may be generated in the ALD process station 400.

As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) upstream of vaporization point 403 may be provided for controlling a mass flow of liquid for vaporization and delivery to ALD process station 400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 406 distributes process gases toward substrate 412. In the embodiment shown in FIG. 4, the substrate 412 is located beneath showerhead 406 and is shown resting on a pedestal 408. Showerhead 406 may have any suitable shape, and may have any suitable number and arrangement of ports for distributing process gases to substrate 412.

In some embodiments, pedestal 408 may be raised or lowered to expose substrate 412 to a volume between the substrate 412 and the showerhead 406. It will be appreciated that, in some embodiments, pedestal height may be adjusted programmatically by a controller 450.

In another scenario, adjusting a height of pedestal 408 may allow a plasma density to be varied during plasma activation cycles in the process in embodiments where a plasma is ignited. At the conclusion of the process phase, pedestal 408 may be lowered during another substrate transfer phase to allow removal of substrate 412 from pedestal 408.

In some embodiments, pedestal 408 may be temperature controlled via heater 410. In some embodiments, the pedestal 408 may be heated to a temperature of at least about 250° C., or in some embodiments, less than about 300° C., such as about 250° C., during deposition of silicon oxide films as described in disclosed embodiments. In some embodiments, the pedestal is set at a temperature between about −50° C. and about 900° C., or between about 50° C. and about 300° C., such as at a temperature between about 200° C. and about 275° C. In some embodiments, the pedestal is set at a temperature between about 50° C. and about 300° C. In some embodiments, the pedestal is set at a temperature between about 200° C. and about 275° C.

Further, in some embodiments, pressure control for ALD process station 400 may be provided by butterfly valve 418. As shown in the embodiment of FIG. 4, butterfly valve 418 throttles a vacuum provided by a downstream vacuum pump (not shown). However, in some embodiments, pressure control of ALD process station 400 may also be adjusted by varying a flow rate of one or more gases introduced to the ALD process station 400.

In some embodiments, a position of showerhead 406 may be adjusted relative to pedestal 408 to vary a volume between the substrate 412 and the showerhead 406. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more controllers 450.

In some embodiments where plasma may be used as discussed above, showerhead 406 and pedestal 408 electrically communicate with a radio frequency (RF) power supply 414 and matching network 416 for powering a plasma. In various embodiments, the pedestal is a powered pedestal and the chamber includes a grounded showerhead. In some embodiments, the pedestal is grounded and the showerhead is powered. The plasma duration used during conversion for short and long conversion times may be controlled using the controller 450. In some embodiments, plasma energy is modulated using a combination of plasma power and conversion duration. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of radical species. Examples of suitable powers are included above. Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to initiate the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas, instructions for modulating the duration of flow of the second reactant gas, instructions for modulating the flow rate of a carrier or purge gas, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. It will be appreciated that these recipe phases may be further subdivided and/or iterated in any suitable way within the scope of the disclosed embodiments. In some embodiments, the controller 450 may include any of the features described below with respect to system controller 550 of FIG. 5.

As described above, one or more process stations may be included in a multi-station processing tool. FIG. 5 shows a schematic view of an embodiment of a multi-station processing tool 500 with an inbound load lock 502 and an outbound load lock 504, either or both of which may include a remote plasma source. A robot 506 at atmospheric pressure is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 includes a remote plasma source, the wafer may be exposed to a remote plasma treatment in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 514 includes four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 514 may include one or more matched pairs of ALD and plasma-enhanced ALD process stations. While the depicted processing chamber 514 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 depicts an embodiment of a wafer handling system for transferring wafers within processing chamber 514. In some embodiments, wafer handling system may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of multi-station processing tool 500. System controller 550 may include one or more memory devices 556, one or more mass storage devices 554, and one or more processors 552. Processor 552 may include a CPU or computer, analog, and/or digital input/output connections, stepper motor controller boards, etc.

In some embodiments, system controller 550 controls all of the activities of multi-station processing tool 500. System controller 550 executes system control software 558 stored in mass storage device 554, loaded into memory device 556, and executed on processor 552. Alternatively, the control logic may be hard coded in the system controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by multi-station processing tool 500. System control software 558 may be configured in any suitable way. For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of multi-station processing tool 500.

A process gas control program may include code for controlling gas composition (e.g., iodine-containing silicon precursor gases, and nitrogen-containing gases, carrier gases and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of multi-station processing tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 550 will typically include one or more memory devices 556 and one or more processors configured to execute the instructions so that the apparatus will perform a method in accordance with disclosed embodiments. Machine-readable media containing instructions for controlling process operations in accordance with disclosed embodiments may be coupled to the system controller 550.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 550, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 550 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 550, in some implementations, may be a part of or coupled to a computer that is integrated with, coupled to the system, otherwise networked to the system, or a combination thereof. For example, the system controller 550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. It should be understood that the parameters may be specific to the type of process to be performed and the type of tool that the system controller 550 is configured to interface with or control. Thus as described above, the system controller 550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and U.S. Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted at 200° C. for various silicon oxide films deposited at different conversion times to evaluate wet etch rate ratio in 200:1 diluted HF for 180 seconds and step coverage at 2000 W of plasma power. The results are depicted in FIG. 6.

Figure 6:
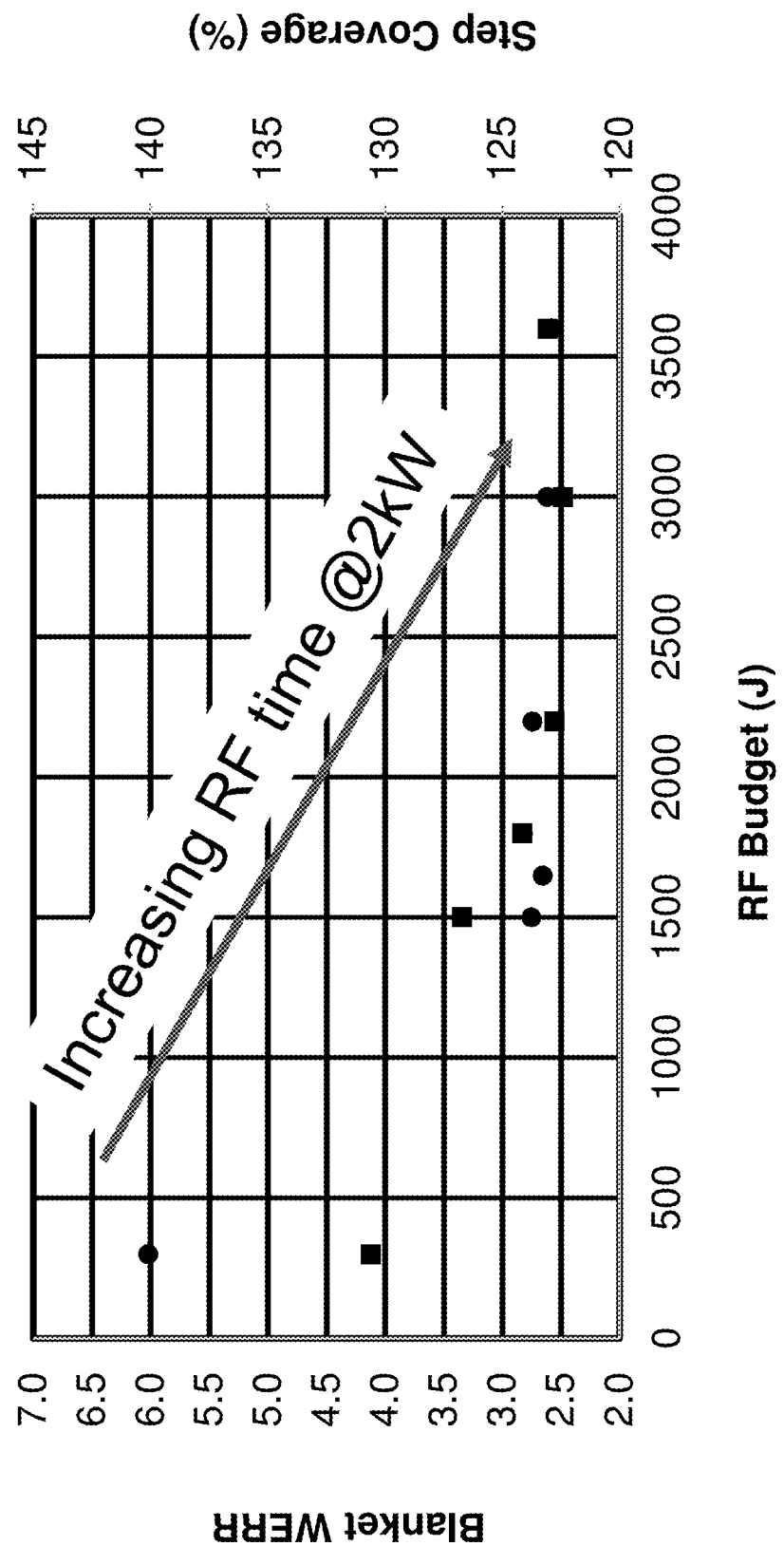
FIG. 6 is a graph depicting wet etch rate and step coverage for silicon oxide films deposited using various plasma energies.

RF conversion time was modulated by varying RF ON time, with increasing conversion time indicated by the arrow in FIG. 6. The circle plots are for wet etch rate ratio (wet etch rate of ALD oxide film normalized by that of thermal oxide) while the square plots are for step coverage. As shown, RF conversion time has a saturation point around 0.75 second for reducing wet etch rate ratio and for achieving good step coverage, and at shorter conversion time (e.g, lower RF budgets), wet etch rate ratio is higher and the step coverage is substantially over 100, while closer to 100 indicates improved step coverage. These results suggest that improved film quality can be achieved at longer RF conversion times, but such conversion times come at a cost of increased time.

Experiment 2

An experiment was conducted at 300° C. to compare wet etch rates of various silicon oxide films deposited using various techniques. Plasma used herein involved a plasma generator at 13 MHz frequency.

The first silicon oxide film (SiOx #1) was deposited using multiple cycles of short conversion (aka low plasma energy) PEALD using repeating cycles of: DIPAS dose, purge, oxygen plasma with argon, purge. RF conversion time during oxygen plasma with argon was 0.15 seconds, and RF power was 2000 W. The duration of one ALD cycle was 0.95 second.

The second silicon oxide film (SiOx #2) was deposited using multiple cycles of alternating between short and long conversion PEALD using cycles of: DIPAS dose, purge, oxygen plasma with argon for an RF conversion time of 0.15 seconds, purge, DIPAS dose, purge, oxygen plasma with argon for an RF conversion time of 0.75 seconds, purge. RF power was 2000 W. The average duration of one ALD cycle was 1.25 seconds.

The third silicon oxide film (SiOx #3) was deposited using multiple cycles of alternating between mid and long conversion PEALD using cycles of: DIPAS dose, purge, oxygen plasma with argon for an RF conversion time of 0.45 seconds, purge, DIPAS dose, purge, oxygen plasma with argon for an RF conversion time of 0.75 seconds, purge. RF power was 2000 W. The average duration of one ALD cycle was 1.4 seconds.

The fourth silicon oxide film (SiOx #4) was deposited using multiple cycles of long conversion PEALD using cycles of: DIPAS dose, purge, oxygen plasma with argon for an RF time of 0.75 seconds, purge. RF power was 2000 W. The average duration of one ALD cycle was 1.55 seconds.

Wet etch rates of each of these silicon oxide films were evaluated in 200:1 hydrofluoric acid for 180 seconds. The results of the wet etch rate values are provided in Table 1 below and in FIG. 7.

TABLE 1

Wet Etch Rates of ALD Silicon Oxide Films

| Silicon Oxide Film # | Plasma Energy in First Cycle (J) | Plasma Energy in Second Cycle (J) | Average RF ON Time (s) | Average Cycle Time (s) | Wet Etch Rate (A/s) | Step Coverage (%) |
|---|---|---|---|---|---|---|
| 1 | 300 | 300 | 0.15 | 0.95 | 1.05 | |
| 2 | 300 | 1500 | 0.45 | 1.25 | 0.56 | |
| 3 | 900 | 1500 | 0.60 | 1.4 | 0.52 | 101 |
| 4 | 1500 | 1500 | 0.75 | 1.55 | 0.49 | 105 |

Figure 7:
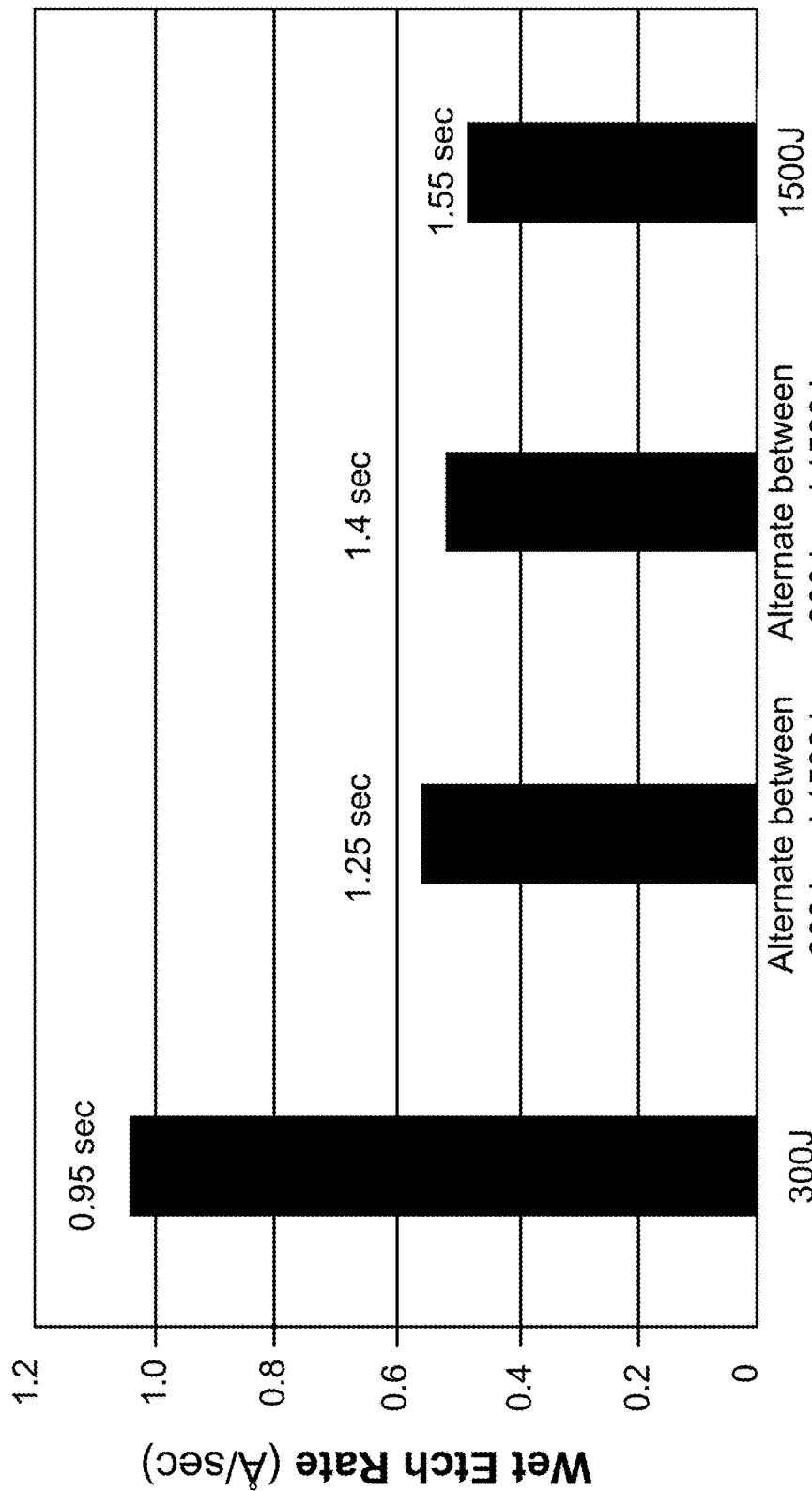
FIG. 7 is a graph comparing wet etch rate for silicon oxide films deposited using different plasma-enhanced atomic layer deposition processes at various constant and alternating conversion times at a given plasma power.

As shown in Table 1 and in FIG. 7, the first technique resulted in an undesirable high wet etch rate. The fourth technique achieved low wet etch rate but used a long conversion (aka high RF budget), which prolongs the duration of the cycles and overall reduces throughput. The second and third techniques achieved low wet etch rates comparable to the fourth technique but without using long conversion times in every ALD cycle and therefore reduces duration of the overall process and increases throughput.

Step coverage for the silicon oxide films deposited using the third and fourth techniques was obtained which showed fairly similar step coverage between the third and fourth techniques, which suggests comparable high quality film results using alternating conversion time PEALD cycles.

Experiment 3

An experiment was conducted to deposit a liner film into a via for fabrication of a contact. A film was deposited using a first cycle of ALD involving dose, purge, conversion for 0.25 seconds, and purge; and a second cycle of ALD involving dose, purge, conversion for 1.55 seconds, and purge. The two cycles were alternated using a conversion plasma power of 5500 W for four substrates. A second film was deposited using only ALD cycles involving dose, purge, conversion for 1.55 seconds, and purge. The resulting wet etch rates of the bottom, middle, and tops of the features were evaluated and are shown in FIG. 8.

Figure 8:
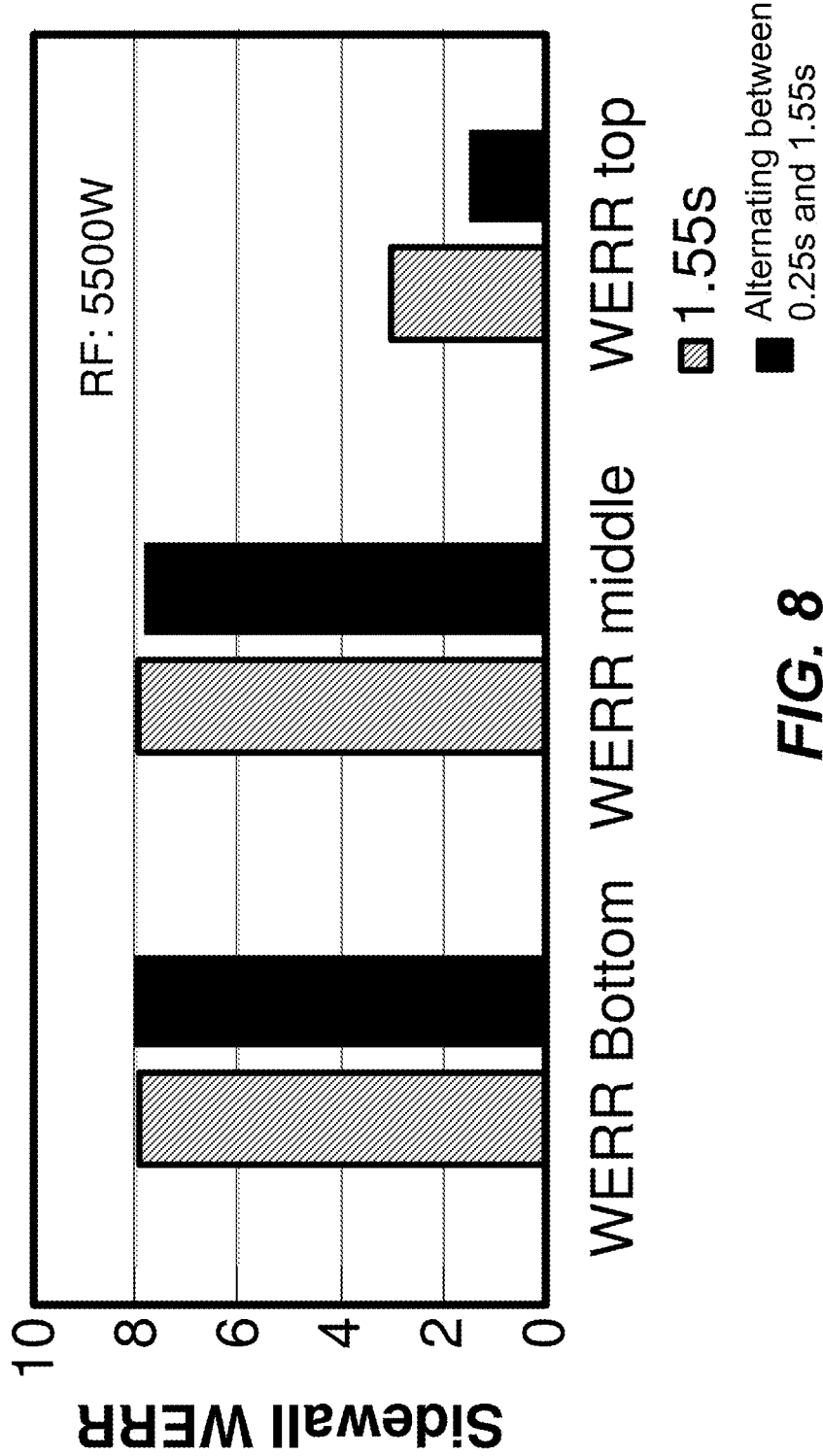
FIG. 8 is a graph comparing wet etch rates of films at the bottom, side, and tops of features deposited using certain disclosed embodiments.

FIG. 8 depicts diagonally shaded bars for films deposited using 1.55 second cycles only and completely shaded bars for films deposited using alternating conversion time cycles. As shown, the two films exhibited similar wet etch rate for bottom and middle, which suggests similar film quality achieved using all 1.55 second conversion times and alternating between 1.55 second and 0.25 second conversion times, the latter of which can increase throughput significantly.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. An apparatus for processing substrates, the apparatus comprising:
    one or more process chambers;
    one or more gas inlets into the one or more process chambers and associated flow control hardware; and
    a controller having at least one processor and a memory, whereby the at least one processor and the memory are communicatively connected with one another, the at least one processor is at least operatively connected with the flow control hardware, and the memory stores computer-executable instructions configured to control the at least one processor to at least control the flow control hardware to:
        cause insertion of a substrate to at least one of the one or more process chambers;
        cause introduction of a first set of alternating flows of a precursor and a reactant into the at least one of the one or more process chambers via the one or more gas inlets for a first duration; and
        subsequent to the first duration, cause introduction of a second set of alternating flows the precursor and the reactant into the at least one of the one or more process chambers via the one or more gas inlets for a second duration; and
    wherein the second duration is at least 1.1 times longer than the first duration.

2. The apparatus of claim 1, further comprising a plasma generator.

3. The apparatus of claim 1, wherein the at least one of the one or more process chambers comprises a powered showerhead and a grounded pedestal to hold the substrate.

4. The apparatus of claim 1, wherein the at least one of the one or more process chambers comprises a powered pedestal to hold the substrate and a grounded showerhead.

5. The apparatus of claim 1, wherein the computer-executable instructions are further configured to control the at least one processor to at least control the flow control hardware to: ignite a plasma to generate the reactant.

6. The apparatus of claim 1, wherein the precursor comprises an aminosilane.

7. The apparatus of claim 6, wherein the aminosilane comprises di-isopropylaminosilane (DIPAS).

8. The apparatus of claim 1, wherein the second duration is up to about 10 times longer than the first duration.

9. The apparatus of claim 1, wherein the second duration is up to about 5 times longer than the first duration.

10. An apparatus for processing substrates, the apparatus comprising:
    one or more process chambers;
    one or more gas inlets into the one or more process chambers and associated flow control hardware;
    a plasma generator; and
    a controller having at least one processor and a memory, whereby the at least one processor and the memory are communicatively connected with one another, the at least one processor is at least operatively connected with the flow control hardware, and the memory stores computer-executable instructions for controlling the at least one processor to at least control the flow control hardware to:
        cause insertion of a substrate to at least one of the one or more process chambers;
        cause introduction of a first set of alternating flows of a precursor and a reactant into the at least one of the one or more process chambers via the one or more gas inlets;
        cause generation of a plasma having a first plasma energy when causing introduction of the reactant during the first set to form a conformal material; and
        subsequent to the introduction of the first set of alternating flows, cause introduction of a second set of alternating flows of the precursor and the reactant into the at least one of the one or more process chambers via the one or more gas inlets; and
        causing generation of a plasma having a second plasma energy at least 1.1 times greater than the first plasma energy when introducing the reactant during the second set to form a conformal material.

11. The apparatus of claim 10, wherein the at least one of the one or more process chambers comprises a powered showerhead and a grounded pedestal to hold the substrate.

12. The apparatus of claim 10, wherein the at least one of the one or more process chambers comprises a powered pedestal to hold the substrate and a grounded showerhead.

13. The apparatus of claim 10, wherein the first plasma energy is between about 200 J and about 500 J per substrate.

14. The apparatus of claim 10, wherein the second plasma is generated using a plasma power between about 125 W to about 1625 W per substrate.

15. The apparatus of claim 10, wherein the precursor comprises an aminosilane.

16. The apparatus of claim 15, wherein the aminosilane comprises di-isopropylaminosilane (DIPAS).

17. An apparatus for processing substrates, the apparatus comprising:
    one or more process chambers;
    one or more gas inlets into the one or more process chambers and associated flow control hardware; and
    a controller having at least one processor and a memory, whereby the at least one processor and the memory are communicatively connected with one another, the at least one processor is at least operatively connected with the flow control hardware, and the memory stores computer-executable instructions configured to control the at least one processor to at least control the flow control hardware to:

provide a substrate to a process chamber;

deposit a first amount of a material over the substrate in a first atomic layer deposition (ALD) cycle, the first ALD cycle comprising:

exposing the substrate to a precursor under conditions allowing the precursor to adsorb onto a surface of the substrate, thereby forming a first adsorbed layer of the precursor; and exposing the first adsorbed layer of the precursor to reactive species for a first duration to form the first amount of the material; and subsequent to the first ALD cycle, deposit a second amount of the material on the first amount of the material using a second ALD cycle, the second ALD cycle comprising:

exposing the substrate to the precursor under conditions allowing the precursor to adsorb onto a surface of the substrate, thereby forming a second adsorbed layer of the precursor; and exposing the second adsorbed layer of the precursor to reactive species for a second duration to form the second amount of the material;

wherein the second duration is longer than the first duration.

18. The apparatus of claim 17, wherein the second duration is up to 10 times longer than the first duration.

19. The apparatus of claim 17, wherein the computer-executable instructions are further configured to control the at least one processor to at least control the flow control hardware to:

repeat the first ALD cycle two or more times before depositing the second amount of the material, repeat the second ALD cycle two or more times, or a combination thereof.

20. The apparatus of claim 17, wherein the computer-executable instructions are further configured to control the at least one processor to at least control the flow control hardware to: cause alternation between the first and second ALD cycles.

* * * * *